(12) United States Patent
Ohsawa et al.

(10) Patent No.: US 9,673,264 B2
(45) Date of Patent: Jun. 6, 2017

(54) DISPLAY DEVICE

(71) Applicant: Semiconductor Energy Laboratory Co., Ltd., Kanagawa-ken (JP)

(72) Inventors: Nobuharu Ohsawa, Kanagawa (JP); Toshiki Sasaki, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/873,938

(22) Filed: Oct. 2, 2015

(65) Prior Publication Data

US 2016/0027849 A1    Jan. 28, 2016

Related U.S. Application Data

(63) Continuation of application No. 13/410,799, filed on Mar. 2, 2012, now Pat. No. 9,153,627.

(30) Foreign Application Priority Data

Mar. 4, 2011  (JP) .................... 2011-048230

(51) Int. Cl.
*H01L 29/08*         (2006.01)
*H01L 51/00*         (2006.01)
(Continued)

(52) U.S. Cl.
CPC ........ *H01L 27/322* (2013.01); *H01L 27/3206* (2013.01); *H01L 27/3211* (2013.01);
(Continued)

(58) Field of Classification Search
CPC .................................................. H01L 27/322
(Continued)

(56) References Cited

U.S. PATENT DOCUMENTS 6,847,163 B1   1/2005  Tsutsui et al.
7,271,537 B2   9/2007  Matsuda et al.
(Continued)

FOREIGN PATENT DOCUMENTS

CN      101874317 A    10/2010
EP      1 672 962 A1    6/2006
(Continued)

OTHER PUBLICATIONS

Kashiwabara, M. et al., "29.5L: Late-News Paper: Advanced AM-OLED Display Based on White Emitter With Microcavity Structure," SID Digest '04: SID International Symposium Digest of Technical Papers, 2004, vol. 35, pp. 1017-1019.
(Continued)

*Primary Examiner* — Igwe U Anya
(74) *Attorney, Agent, or Firm* — Husch Blackwell LLP

(57) ABSTRACT

To provide a display device with low power consumption. The display device includes a plurality of pixels each having a light-emitting element having a structure in which light emitted from a light-emitting layer is resonated between a reflective electrode and a light-transmitting electrode, wherein no color filter layers are provided or color filter layers with high transmittance are provided in pixels for light with relatively short wavelengths (e.g., pixels for blue and/or green), and a color filter layer is selectively provided in pixels for light with a long wavelength (e.g., pixels for red), and thereby maintaining color reproducibility and consuming less power.

19 Claims, 12 Drawing Sheets

(51) Int. Cl.
*H01L 27/32* (2006.01)
*H01L 51/52* (2006.01)
*H01L 51/50* (2006.01)

(52) U.S. Cl.
CPC ...... *H01L 51/5016* (2013.01); *H01L 51/5265* (2013.01); *H01L 51/006* (2013.01); *H01L 51/0054* (2013.01); *H01L 51/0058* (2013.01); *H01L 51/0072* (2013.01); *H01L 51/0074* (2013.01); *H01L 51/0085* (2013.01); *H01L 51/5218* (2013.01); *H01L 51/5221* (2013.01)

(58) Field of Classification Search
USPC .......................................................... 257/40
See application file for complete search history.

(56) References Cited

U.S. PATENT DOCUMENTS

| | | |
|---|---|---|
| 7,317,282 B2 | 1/2008 | Tsutsui et al. |
| 7,462,883 B2 | 12/2008 | Kumaki et al. |
| 7,554,265 B2 | 6/2009 | Godo et al. |
| 7,564,052 B2 | 7/2009 | Kumaki |
| 7,601,988 B2 | 10/2009 | Seo et al. |
| 7,737,626 B2 | 6/2010 | Kumaki et al. |
| 7,741,770 B2 | 6/2010 | Cok et al. |
| 7,753,751 B2 | 7/2010 | Yamazaki |
| 7,851,989 B2 | 12/2010 | Noda |
| 7,875,893 B2 | 1/2011 | Seo et al. |
| 7,893,427 B2 | 2/2011 | Kumaki et al. |
| 7,902,742 B2 | 3/2011 | Suzuki et al. |
| 7,960,908 B2 | 6/2011 | Okutani et al. |
| 7,964,891 B2 | 6/2011 | Kumaki et al. |
| 7,973,319 B2 | 7/2011 | Kashiwabara et al. |
| 8,008,652 B2 | 8/2011 | Kumaki et al. |
| 8,022,620 B2 | 9/2011 | Kobayashi |
| 8,080,934 B2 | 12/2011 | Kido et al. |
| 8,314,548 B2 | 11/2012 | Suzuki et al. |
| 8,415,686 B2 | 4/2013 | Kashiwabara et al. |
| 8,587,193 B2 | 11/2013 | Suzuki et al. |
| 8,786,183 B2 | 7/2014 | Suzuki et al. |
| 9,041,282 B2 | 5/2015 | Suzuki et al. |
| 9,123,666 B2 | 9/2015 | Kashiwabara et al. |
| 9,373,672 B2 | 6/2016 | Kashiwabara et al. |
| 2003/0044639 A1 | 3/2003 | Fukuda |
| 2005/0088085 A1 | 4/2005 | Nishikawa et al. |
| 2005/0106419 A1 | 5/2005 | Endoh et al. |
| 2005/0280008 A1 | 12/2005 | Ricks et al. |
| 2006/0108592 A1* | 5/2006 | Nishimura ............. C09K 11/06 257/89 |
| 2006/0163597 A1 | 7/2006 | Noda et al. |
| 2006/0267483 A1 | 11/2006 | Tsutsui et al. |
| 2006/0284204 A1 | 12/2006 | Yamazaki et al. |
| 2007/0001570 A1 | 1/2007 | Nomura et al. |
| 2007/0015429 A1* | 1/2007 | Maeda ................ H01L 51/5265 445/24 |
| 2007/0102737 A1* | 5/2007 | Kashiwabara ...... H01L 27/3211 257/291 |
| 2007/0145350 A1* | 6/2007 | Kobori .................. H01L 27/322 257/13 |
| 2007/0176161 A1 | 8/2007 | Seo et al. |
| 2007/0221943 A1* | 9/2007 | Moriya ............. G02F 1/133603 257/99 |
| 2008/0241586 A1 | 10/2008 | Kumaki et al. |
| 2009/0275161 A1 | 11/2009 | Kumaki et al. |
| 2010/0051973 A1* | 3/2010 | Kobayashi .......... H01L 51/5092 257/88 |
| 2010/0066239 A1* | 3/2010 | Spindler ............. H01L 51/5036 313/504 |
| 2010/0176720 A1 | 7/2010 | Yamazaki |
| 2010/0231484 A1 | 9/2010 | Cok et al. |
| 2011/0084257 A1* | 4/2011 | Kwon ................. H01L 27/3276 257/40 |
| 2011/0095276 A1* | 4/2011 | Imai ...................... H01L 27/322 257/40 |
| 2011/0101345 A1 | 5/2011 | Kumaki et al. |
| 2011/0101380 A1 | 5/2011 | Kumaki et al. |
| 2011/0101387 A1* | 5/2011 | Kinomoto .............. C09K 11/62 257/89 |
| 2011/0108864 A1 | 5/2011 | Seo et al. |
| 2011/0140101 A1 | 6/2011 | Noda |
| 2011/0241007 A1 | 10/2011 | Kumaki et al. |
| 2011/0278562 A1 | 11/2011 | Kumaki et al. |
| 2011/0291088 A1 | 12/2011 | Seo et al. |
| 2011/0309351 A1 | 12/2011 | Kumaki et al. |
| 2012/0038862 A1 | 2/2012 | Shiau et al. |
| 2012/0126272 A1* | 5/2012 | Kurata .................. H05B 33/14 257/98 |
| 2013/0207138 A1 | 8/2013 | Kashiwabara et al. |
| 2015/0295017 A1 | 10/2015 | Kashiwabara et al. |
| 2016/0293673 A1 | 10/2016 | Kashiwabara et al. |

FOREIGN PATENT DOCUMENTS

| | | |
|---|---|---|
| EP | 1 876 659 A1 | 1/2008 |
| EP | 2 256 841 A1 | 12/2010 |
| EP | 2 509 397 A1 | 10/2012 |
| EP | 2 975 665 A1 | 1/2016 |
| JP | 07-220871 A | 8/1995 |
| JP | 10-039791 A | 2/1998 |
| JP | 2000-235891 A | 8/2000 |
| JP | 2006-278258 A | 10/2006 |
| JP | 2007-011063 A | 1/2007 |
| JP | 2010-541180 | 12/2010 |
| TW | 200524474 | 7/2005 |
| TW | 200818980 | 4/2008 |
| WO | WO 2005/039248 A1 | 4/2005 |
| WO | WO 2009/048520 A1 | 4/2009 |

OTHER PUBLICATIONS

Matsumoto, T. et al., "27.5L: Late-News Paper: Multiphoton Organic EL Device Having Charge Generation Layer," SID Digest '03: SID International Symposium Digest of Technical Papers, 2003, vol. 34, pp. 979-981.

Taiwanese Office Action re Application No. TW 105112438, dated Jan. 19, 2017.

* cited by examiner

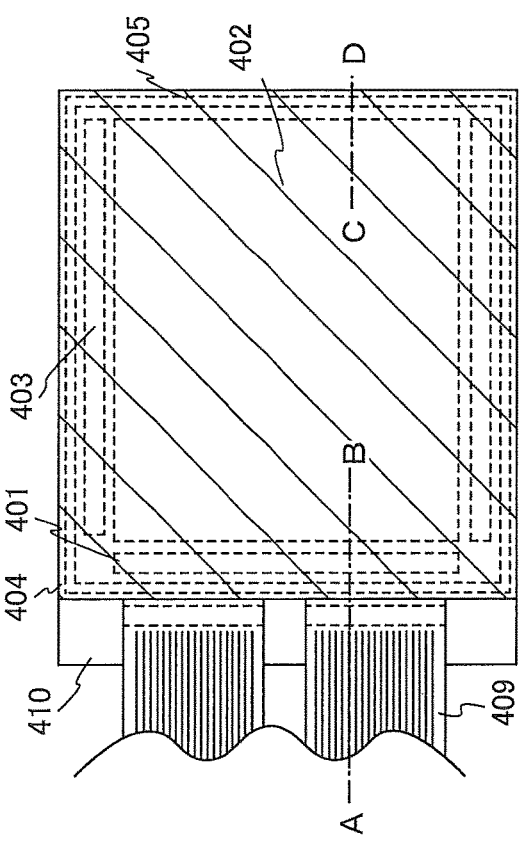
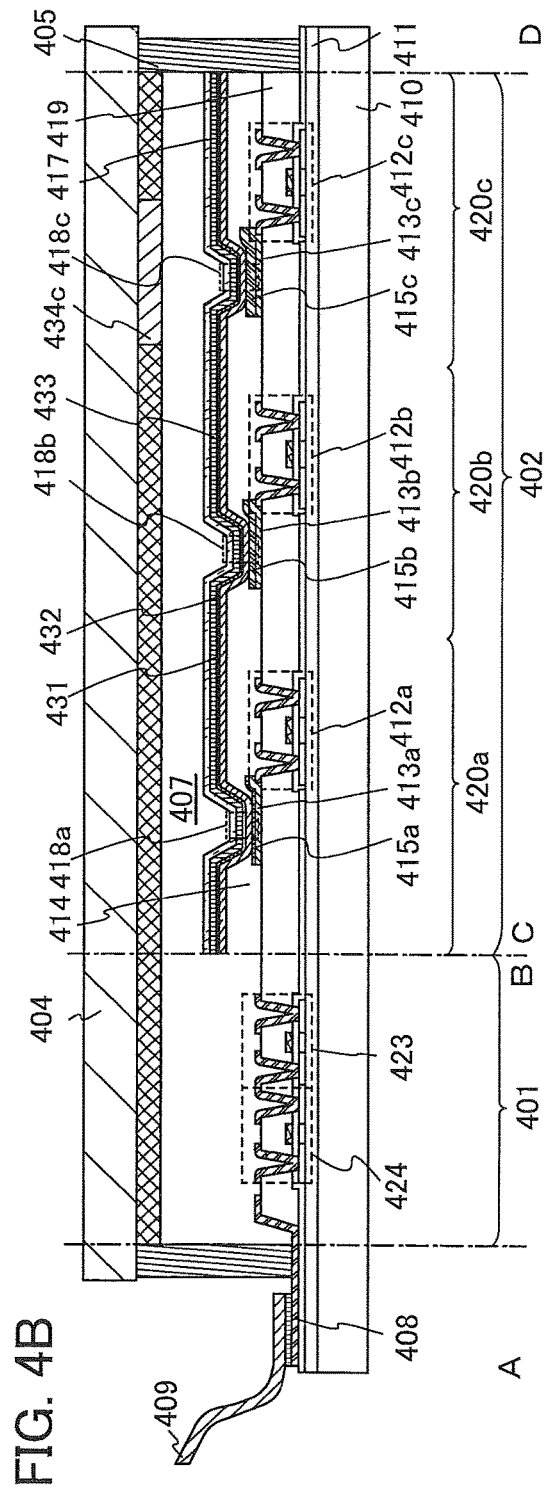
FIG. 4A
FIG. 4B

DISPLAY DEVICE

This application is a continuation of copending U.S. application Ser. No. 13/410,799, filed on Mar. 2, 2012 which is incorporated herein by reference.

BACKGROUND OF THE INVENTION

1. Field of the Invention

One embodiment of the present invention relates to an electroluminescence display device and a manufacturing method of the display device.

2. Description of the Related Art

In recent years, as display devices (so-called flat panel displays) which are very thin and light, electroluminescence (hereinafter, also referred to as EL) display devices have been attracting attentions.

As a multicolor display method of an EL display device, there is proposed a method in which a light-emitting element for white light and a color filter are combined (see, for example, Patent Document 1). In this method, it has been thought that it is not necessary to separately form light-emitting elements using light-emitting materials for different emission colors in every pixel, and thus high definition can be achieved.

However, when a color filter is used, light other than light in a particular wavelength band is absorbed by the color filter, so that there is a loss of light and light emitted from a light-emitting element cannot be used effectively. For this reason, in order to obtain a desired luminance sufficiently, a loss of light needs to be compensated by an increase in luminance of the light-emitting element, which results in an increase in power consumption unfortunately.

REFERENCE

[Patent Document 1] Japanese Published Patent Application No. H07-220871

SUMMARY OF THE INVENTION

In view of the above, it is an object of one embodiment to decrease power consumption of an EL display device for multicolor display.

One embodiment of the present invention includes a plurality of pixels each including a light-emitting element having a structure of resonating light emitted from a light-emitting layer, between a reflective electrode and a light-transmitting electrode. In a pixel of an emission color with a relatively short wavelength (for example, a pixel for blue light and/or a pixel for green light), a color filter layer is not provided or a color filter layer having a high transmittance is provided, and in a pixel of an emission color with a long wavelength (for example, a pixel for red light), a color filter layer is selectively provided, so that a display device having high color reproducibility and low power consumption can be provided. In addition, a plurality of light-emitting elements in each pixel have a common structure between pixels, without being formed separately. In this manner, a display device with high definition can be provided. Specifically, the following structure can be employed, for example.

One embodiment of the present invention is a display device comprising a first substrate provided with a first light-emitting element, a second light-emitting element, and a third light-emitting element; and a second substrate including a first region overlapping with the first light-emitting element, a second region overlapping with the second light-emitting element, a third region overlapping with the third light-emitting element, and a color filter layer at least in the third region. In the display device, the first light-emitting element includes, between a first reflective electrode and a light-transmitting electrode, a first light-emitting layer having a maximum emission peak in a blue wavelength region, a second light-emitting layer having a maximum emission peak in a green wavelength region, and a third light-emitting layer having a maximum emission peak in a red wavelength region, and light emitted from the first light-emitting layer is resonated between the first reflective electrode and the light-transmitting electrode; the second light-emitting element includes the first light-emitting layer, the second light-emitting layer, and the third light-emitting layer between a second reflective electrode and the light-transmitting electrode, and light emitted from the second light-emitting layer is resonated between the second reflective electrode and the light-transmitting electrode; and the third light-emitting element includes the first light-emitting layer, the second light-emitting layer, and the third light-emitting layer between a third reflective electrode and the light-transmitting electrode, and light emitted from the third light-emitting layer is resonated between the third reflective electrode and the light-transmitting electrode; the first region has a maximum transmittance of 80% or more in the blue wavelength region, the second region has a maximum transmittance of 75% or more in the green wavelength region, and the color filter layer in the third region has a transmission center wavelength in the red wavelength region.

In the display device, a color filter layer having a transmission center wavelength in the green wavelength region may be provided in the second region.

In the display device, the color filter layer provided in the second region may have a maximum transmittance of 10% or more in a wavelength region of from 380 nm to 450 nm, inclusive.

In the display device, a color filter layer having a transmission center wavelength in the blue wavelength region may be provided in the first region.

In the display device, the color filter layer provided in the first region may have a maximum transmission of 5% or more in a wavelength region of from 570 nm to 760 nm, inclusive.

In the display device, the second light-emitting element may include a first light-transmitting conductive layer so as to be in contact with the second reflective electrode, and the third light-emitting element may include a second light-transmitting conductive layer having a thickness different from that of the first light-transmitting conductive layer, so as to be in contact with the third reflective electrode.

In the display device, the area of the first region is preferably smaller than that of the third region.

In accordance with one embodiment of the present invention, a display device that achieves low power consumption can be provided.

Further, in accordance with one embodiment of the present invention, a display device with high color reproducibility can be provided.

Accordingly, in accordance with one embodiment of the present invention, a display device with high definition can be provided.

BRIEF DESCRIPTION OF THE DRAWINGS

In the accompanying drawings:

FIGS. 4A and 4B illustrate a display device in accordance with one embodiment of the present invention;

DETAILED DESCRIPTION OF THE INVENTION

Figure 1A:
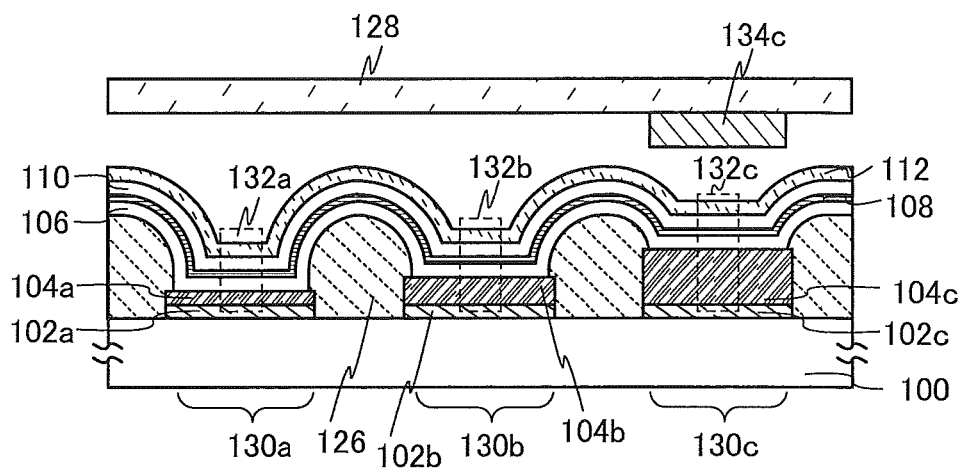
FIGS. 1A and 1B each illustrate a display device in accordance with one embodiment of the present invention.

Embodiments will be described with reference to the drawings. However, the present invention is not limited to the following description, and various changes for the modes and details thereof will be apparent to those skilled in the art unless such changes depart from the spirit and the scope of the invention. Therefore, the present invention is not construed as being limited to description of the embodiments. In the structures to be given below, the same portions or portions having similar functions are denoted by the same reference numerals in different drawings, and explanation thereof will not be repeated in some cases.

Note that in this specification and the like, the terms of ordinal numbers such as the first to the N-th (N is a natural number) are used conveniently for preventing confusion between components, and thus do not limit a process order or a stack order numerically. In addition, the ordinal numbers in this specification do not denote particular names which specify the present invention.

Embodiment 1

A display device in this embodiment includes a first substrate that is provided with a first light-emitting element, a second light-emitting element, and a third light-emitting element; a first region (included in a first pixel) overlapping with the first light-emitting element and sandwiched between the first light-emitting element and a second substrate; a second region (included in a second pixel) overlapping with the second light-emitting element and sandwiched between the second light-emitting element and the second substrate; a third region (included in a third pixel) overlapping with the third light-emitting element and sandwiched between the third light-emitting element and the second substrate; and a second substrate that is provided with a color filter layer in at least the third region.

The first light-emitting element includes, between a first reflective electrode and a light-transmitting electrode, a first light-emitting layer having a maximum emission peak in a blue wavelength region, a second light-emitting layer having a maximum emission peak in a green wavelength region, and a third light-emitting layer having a maximum emission peak in a red wavelength region, and light emitted from the first light-emitting layer is resonated between the first reflective electrode and the light-transmitting electrode. In addition, the second light-emitting element includes, between a second reflective electrode and the light-transmitting electrode, the first light-emitting layer, the second light-emitting layer, and the third light-emitting layer, and light emitted from the second light-emitting layer is resonated between the second reflective electrode and the light-transmitting electrode. In addition, the third light-emitting element includes, between a third reflective electrode and the light-transmitting electrode, the first light-emitting layer, the second light-emitting layer, and the third light-emitting layer, and light emitted from the third light-emitting layer is resonated between the third reflective electrode and the light-transmitting electrode.

The display device in this embodiment has the maximum transmittance in the blue wavelength region of 80% or more in the first region (included in the first pixel), the maximum transmittance in the green wavelength region of 75% or more in the second region (included in the second pixel), and the color filter layer provided in the third region (included in the third pixel) has a transmission center wavelength in the red wavelength region.

One specific embodiment of an EL display device will be described below with reference to FIGS. 1A and 1B, FIG. 2, and FIGS. 3A to 3C.

FIG. 1A illustrates a structural example of a cross-sectional view of a display portion in the display device in this embodiment.

The display device illustrated in FIG. 1A includes a first pixel 130a, a second pixel 130b, and a third pixel 130c. The first pixel 130a includes a first light-emitting element 132a provided over a substrate 100. A second pixel 130b includes a second light-emitting element 132b provided over the substrate 100. A third pixel 130c includes a third light-emitting element 132c provided over the substrate 100, and a color filter layer 134c provided in a region overlapping with the third light-emitting element 132c, in a counter substrate 128.

The first light-emitting element 132a, the second light-emitting element 132b, and the third light-emitting element 132c include a first reflective electrode 102a, a second reflective electrode 102b, and a third reflective electrode 102c, respectively, which are disposed separately from each other over the substrate 100. In addition, the first light-emitting element 132a, the second light-emitting element 132b, and the third light-emitting element 132c are electrically insulated from each other by an insulating layer 126.

The insulating layer 126 is formed using an organic insulating material such as polyimide, acrylic, polyimide, or epoxy, or an inorganic insulating material. Preferably, the insulating layer 126 is formed using a photosensitive resin material, in particular, in such a way that an opening is formed over the reflective electrode and a sidewall of the opening has an inclined surface with continuous curvature. The insulating layer 126 may be tapered or inversely tapered.

The first light-emitting element 132a includes an EL layer between the first reflective electrode 102a and a light-transmitting electrode 112. The EL layer includes at least the first light-emitting layer having a maximum emission peak in a blue wavelength region, the second light-emitting layer having a maximum emission peak in a green wavelength region, and the third light-emitting layer having a maximum emission peak in a red wavelength region. In addition, the EL layer can have a stacked-layer structure including a hole-injection layer, a hole-transport layer, an electron-transport layer, an electron-injection layer, and/or the like, in addition to the first to third light-emitting layers. In addition, a plurality of EL layers may be stacked and a charge-generation layer may be provided between one EL layer and another EL layer.

Note that in this specification and the like, specifically, the blue wavelength region means a wavelength region of from 430 nm to 470 nm, the green wavelength region means a wavelength region of from 500 nm to 550 nm, and the red wavelength region means a wavelength region of from 600 nm to 700 nm.

In addition, the second light-emitting element 132b includes an EL layer between the second reflective electrode 102b and the light-transmitting electrode 112, the third light-emitting element 132c includes an EL layer between the third reflective electrode 102c and the light-transmitting electrode 112. The EL layers included in the second light-emitting element 132b and the third light-emitting element 132c are common to that of the first light-emitting element 132a, and the EL layers are continuous (i.e., a continuous layer) between the first light-emitting element 132a, the second light-emitting element 132b, and the third light-emitting element 132c. Note that light emitted from the first light-emitting element 132a, the second light-emitting element 132b, and the third light-emitting element 132c are output through the light-transmitting electrode 112.

In this embodiment, between the electrodes having reflectivity (the first reflective electrode 102a, the second reflective electrode 102b, and the third reflective electrode 102c) and the light-transmitting electrode 112, a first EL layer 106 including the first light-emitting layer, a charge-generation layer 108, and a second EL layer 110 including the second light-emitting layer and the third light-emitting layer are sequentially stacked. Note that one embodiment of the present invention can employ a light-emitting element with this structure, but is not limited to, and for example, the stack order of the first light-emitting layer, the second light-emitting layer, and the third light-emitting layer can be changed.

In the first light-emitting element 132a, the second light-emitting element 132b and the third light-emitting element 132c, the first EL layer 106, the charge-generation layer 108, and the second EL layer 110 are each a common layer and continuous between pixels. Accordingly, in the manufacturing process, the layers are not necessarily formed with use of a metal mask, and thus a film can be formed over a large area, which can allow the display device to be enlarged and formed with high productivity. Further, a display region can be enlarged in a display portion. Furthermore, defects generated due to entry of particles in using a metal mask can be prevented, and thereby a display device can be manufactured with high yield.

In addition, the first light-emitting element 132a, the second light-emitting element 132b, and the third light-emitting element 132c include a first light-transmitting conductive layer 104a, a second light-transmitting conductive layer 104b, and a third light-transmitting conductive layer 104c, respectively, which have a different thickness from each other, and thereby the elements 132a, 132b, and 132c also have different thicknesses.

The film thickness of the first light-transmitting conductive layer 104a provided in the first light-emitting element 132a is controlled, so that an optical path length can be adjusted to resonate light (light with a maximum emission peak in the blue wavelength region) emitted from the first light-emitting layer to be intensified between the first reflective electrode 102a and the light-transmitting electrode 112.

The film thickness of the second light-transmitting conductive layer 104b provided in the second light-emitting element 132b is controlled, so that an optical path length can be adjusted to resonate light (light with a maximum emission peak in the green wavelength region) emitted from the second light-emitting layer to be intensified between the second reflective electrode 102b and the light-transmitting electrode 112.

The film thickness of the third light-transmitting conductive layer 104c provided in the third light-emitting element 132c is controlled, so that an optical path length can be adjusted to resonate light (light with a maximum emission peak in the red wavelength region) emitted from the third light-emitting layer to be intensified between the third reflective electrode 102c and the light-transmitting electrode 112.

By the adjustment of each optical path length so as to resonate light emitted from each light-emitting layer to be intensified, such resonated light can exhibit a higher front luminance in the case where the same amount of current is applied. Therefore, the emission efficiency of each light-emitting element can be increased. In addition, by selectively amplifying light of each wavelength region, a light-emitting element with higher color purity can be provided.

For example, the film thickness of the light-transmitting conductive layer 104 (the first light-transmitting conductive layer 104a, the second light-transmitting conductive layer 104b, or the third light-transmitting conductive layer 104c) may be controlled so that the optical path length between the reflective electrode 102 (the first reflective electrode 102a, the second reflective electrode 102b, and the third reflective electrode 102c) and the light-transmitting electrode 112 can be $(2n-1)/4$ times (n is a natural number) a desired wavelength.

Note that when a functional layer is provided for the first EL layer 106 or the like, the optical path length between the first reflective electrode 102a and the light-transmitting electrode 112 may be adjusted by controlling the film thickness of the functional layer. In this case, the first light-transmitting conductive layer 104a is not necessarily provided.

In the display device illustrated in FIG. 1A, the first light-emitting element 132a included in the first pixel 130a is an element with improved blue color purity by an optical resonant structure (so-called micro cavity structure). The blue wavelength region lies in a short wavelength of from 430 nm to 470 nm, and thus the resonant wavelength in the first light-emitting element 132a is also short, as a result, colors other than blue are hardly mixed. Accordingly, the first pixel 130a can exhibit good blue chromaticity even when no color filter layer is provided for the first pixel 130a. Therefore, light absorption that might occur when a color filter layer is provided for the first pixel 130a can be eliminated, which can lead to improvement in use efficiency of light.

In addition, the second light-emitting element 132b included in the second pixel 130b is an element with improved green color purity by an optical resonant structure (so-called micro cavity structure). The green wavelength region lies in a relatively short wavelength of from 500 nm to 550 nm, and thus the second pixel 130b can exhibit good green chromaticity even when no color filter layer is provided for the second pixel 130*b* either. Therefore, light absorption that might occur when a color filter layer is provided for the second pixel 130*b* can be eliminated, which can lead to improvement in use efficiency of light.

Also, the third light-emitting element 132*c* included in the third pixel 130*c* is an element with improved red color purity by an optical resonant structure (so-called micro cavity structure). However, the red wavelength region lies in a long wavelength region of from 600 nm to 700 nm, and thus in the third light-emitting element 132*c*, the resonant wavelength of light exhibiting red color is close to the resonant wavelength of light with a short wavelength (light exhibiting blue color or the like) and causes a mixed color in some cases. For example, because a 1 wavelength of light exhibiting red color matches a 3/2 wavelength of light exhibiting blue color, if an optical design is set to resonate light with a wavelength of 600 nm, light with a wavelength of 400 nm may also be resonated. For this reason, the color filter layer 134*c* is preferably provided for the third pixel 130*c*.

Note that it is preferable that the color filter layer 134*c* has a transmission center wavelength in the red wavelength region (for example, the transmission center wavelength is 690 nm), because light emitted from the third light-emitting element 132*c* can be output efficiently.

In this specification, the "transmission center wavelength" means a center wavelength of the wavelength region (preferably, a wavelength region with transmittance of 50% or more) of light transmitted through a color filter layer in the visible light region (380 nm to 780 nm). For example, when the wavelength region of light transmitted through a color filter layer having a transmission center wavelength in the blue wavelength region is 380 nm to 520 nm, the transmission center wavelength is 450 nm; when the wavelength region of light transmitted through a color filter layer having a transmission center wavelength in the green wavelength region is 510 nm to 590 nm, the transmission center wavelength is 550 nm; and when the wavelength region of light transmitted through a color filter layer having a transmission center wavelength in the red wavelength region is 600 nm to 780 nm, the transmission center wavelength is 690 nm.

As the color filter layer 134*c*, for example, a chromatic light-transmitting resin can be used. As such a chromatic light-transmitting resin, a photosensitive organic resin or a nonphoptosensitive organic resin can be used. A photosensitive organic resin layer is preferable, because the number of resist masks can be decreased, leading to simplification of a process.

Chromatic colors are colors except achromatic colors such as black, gray, and white. A color filter layer is made of a material which transmits only the chromatic color light that is colored. As chromatic color, red, green, blue, or the like can be used. Alternatively, cyan, magenta, yellow, or the like may also be used. "Transmitting only the chromatic-color light that is colored" means that the light transmitted through the color filter layer has a peak at a wavelength of the chromatic-color light.

This embodiment describes the example in which the color filter layer 134*c* is provided on the inner side of the counter substrate 128, but the present invention is not limited to the example, and the color filter layer 134*c* can be provided on the outer side of the counter substrate 128 (the side opposite to the light-emitting element). Alternatively, over the third light-emitting element 132*c*, a chromatic light-transmitting resin serving as a color filter layer may be formed.

As illustrated in FIG. 1A, the first pixel 130*a* for blue (B) and the second pixel 130*b* for green (G) are not provided with a color filter layer, while the third pixel 130*c* for red (R) is selectively provided with the color filter layer 134*c*. By this structure, lower power consumption of a display device can be achieved, keeping high color reproducibility and high national television standards committee (NTSC) ratio.

As described above, the first light-emitting element 132*a* provided in the first pixel 130*a* hardly mixes colors other than blue, and thus can provide higher use efficiency of light than the third light-emitting element 132*c* provided in the third pixel 130*c*. Therefore, even when the area of the first pixel 130*a* is made smaller than that of the third pixel 130*c*, sufficient color reproducibility can be achieved. For example, when the light use efficiency of the first light-emitting element 132*a* is four times that of the third light-emitting element 132*c*, the area of the first pixel 130*a* can be ¼ to ⅓ of that of the third pixel 130*c*. The first pixel 130*a* has no color filter layer; therefore, the area of the first pixel 130*a* is made small, thereby reducing reflection of external light by the first reflective electrode 102*a* on a display surface. Thus, the contrast of the display device can be increased.

In addition, in the display device illustrated in FIG. 1A, a light-blocking layer may be provided in a region overlapping with the insulating layer 126. The light-blocking layer is formed using a light-blocking material that reflects or absorbs light. For example, a black organic resin can be used, which can be formed by mixing a black resin of a pigment material, carbon black, titanium black, or the like into a resin material such as photosensitive or non-photosensitive polyimide. Alternatively, a light-blocking metal film can be used, which may be formed using chromium, molybdenum, nickel, titanium, cobalt, copper, tungsten, aluminum, or the like, for example.

There is no particular limitation on the formation method of the light-blocking layer, and a dry method such as evaporation, sputtering, CVD, or the like or a wet method such as spin coating, dip coating, spray coating, droplet discharging (e.g., ink jetting), printing (e.g., screen printing, or offset printing), or the like may be used depending on a material used. If needed, an etching method (dry etching or wet etching) may be employed to form a desired pattern.

Further, the light-blocking layer can prevent light leakage to an adjacent pixel, which enables higher contrast and higher definition display.

In the display device illustrated in FIG. 1A, as the substrate 100, plastic (an organic resin), glass, quartz, or the like can be used. As an example of plastic, a member made of polycarbonate, polyarylate, polyethersulfone, or the like can be given. Plastic is preferably used for the substrate 100, in which case a reduction in the weight of the display device can be achieved. Alternatively, a sheet with a high barrier property against water vapor and a high heat radiation property (e.g., a sheet including diamond like carbon (DLC)) can be used for the substrate 100.

Although not illustrated, a structure in which an inorganic insulator is provided over the substrate 100 may be employed. The inorganic insulator functions as a protective layer or a sealing film which blocks an external contaminant such as water. By providing the inorganic insulator, deterioration of the light-emitting element can be suppressed; thus, the durability and lifetime of the display device can be improved.

A single layer or a stack of a nitride film and a nitride oxide film can be used as the inorganic insulator. Specifically, the inorganic insulator can be formed using silicon oxide, silicon nitride, silicon oxynitride, aluminum oxide, aluminum nitride, aluminum oxynitride, or the like by a CVD method, a sputtering method, or the like depending on a material used. Preferably, the inorganic insulator is formed using silicon nitride by a CVD method. The film thickness of the inorganic insulator may be greater than or equal to 100 nm and less than or equal to 1 μm. Alternatively, an aluminum oxide film, a DLC film, a carbon film containing nitrogen, or a film containing zinc sulfide and silicon oxide ($ZnS.SiO_2$ film) may be used as the inorganic insulator.

Alternatively, a thin glass substrate can be used as the inorganic insulator. For example, a glass substrate with a thickness greater than or equal to 30 μm and less than or equal to 100 μm can be used.

A metal plate may be provided on a bottom surface of the substrate 100 (a surface opposite to the surface over which the light-emitting element is provided). In the case where an inorganic insulator is provided, a metal plate may be used instead of the substrate 100. Although there is no particular limitation on the thickness of the metal plate, a metal plate with a thickness greater than or equal to 10 μm and less than or equal to 200 μm is preferably used, in which case a reduction in the weight of the display device can be achieved. Further, although there is no particular limitation on the material of the metal plate, a metal such as aluminum, copper, or nickel, a metal alloy such as an aluminum alloy or stainless steel, or the like can be preferably used.

The metal plate and the substrate 100 can be bonded to each other with an adhesive layer. As the adhesive layer, a visible light curable adhesive, an ultraviolet curable adhesive, or a thermosetting adhesive can be used. As examples of materials of such adhesives, an epoxy resin, an acrylic resin, a silicone resin, a phenol resin, and the like can be given. A moisture-absorbing substance serving as a desiccant may be contained in the adhesive layer.

A metal plate has low moisture permeability; thus, by providing the metal plate, the entry of moisture into the light-emitting element can be prevented. Consequently, by providing the metal plate, a highly reliable display device in which deterioration due to moisture is suppressed can be provided.

Note that an inorganic insulating film may be formed to cover the first light-emitting element 132a, the second light-emitting element 132b, and the third light-emitting element 132c. The inorganic insulating film serves as a protective layer or a sealing film which blocks an external contaminant such as water. By providing the inorganic insulating film, the deterioration of the light-emitting element can be inhibited; thus, the durability and lifetime of the display device can be improved. A material similar to the material of the inorganic insulator described above can be used as a material of the inorganic insulating film.

A moisture-absorbing substance which serves as a desiccant may be provided between the substrate 100 and the counter substrate 128. The moisture-absorbing substance may be provided in a solid state such as powdery state or may be provided in a state of a film containing a moisture-absorbing substance, over the first light-emitting element 132a, the second light-emitting element 132b, and the third light-emitting element 132c by a film formation method such as a sputtering method.

A material similar to that of the substrate 100 can be used for the counter substrate 128. The counter substrate 128 should have a property of transmitting visible light rays. In addition, a polarizing plate, an optical film, or the like may be provided for the counter substrate 128. With use of the polarizing plate, the optical film, or the like, reflection of external light on the first pixel 130a and the second pixel 130b can be prevented, which leads to improvement of the contrast.

Figure 1B:
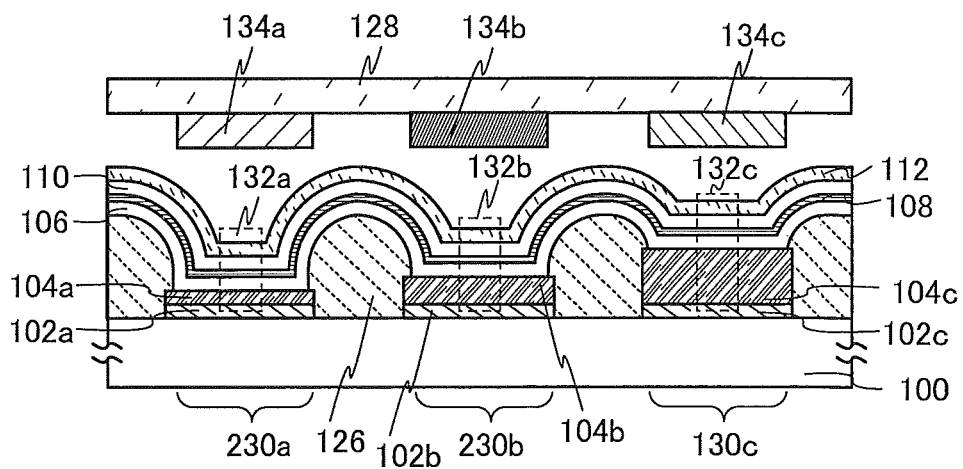

Alternatively, a color filter layer with high transmittance may be provided for the first pixel 130a and/or the second pixel 130b, which leads to improving the contrast as well as keeping low power consumption. FIG. 1B illustrates an example in which a color filter layer with high transmittance is provided for each of the first pixel 130a and the second pixel 130b in the display device illustrated in FIG. 1A. Note that most parts of the structure of the display device illustrated in FIG. 1B are common to those of the display device illustrated in FIG. 1A, and thus description of the common parts is sometimes not given.

The display device illustrated in FIG. 1B includes a first pixel 230a, a second pixel 230b, and the third pixel 130c. The first pixel 230a includes the first light-emitting element 132a provided for the substrate 100 and a color filter layer 134a provided in a region overlapping with the first light-emitting element 132a in the counter substrate 128. The second pixel 230b includes the second light-emitting element 132b provided for the substrate 100 and a color filter layer 134b provided in a region overlapping with the second light-emitting element 132b in the counter substrate 128. The third pixel 130c includes the third light-emitting element 132c provided for the substrate 100 and the color filter layer 134c provided in a region overlapping with the third light-emitting element 132c in the counter substrate 128.

In FIG. 1B, the color filter layer 134a preferably has a transmission center wavelength in the blue wavelength region (for example, the transmission center wavelength is 450 nm), because light emitted from the first light-emitting element 132a can be output efficiently.

In general, a color filter layer with high transmittance of light in a particular wavelength region easily transmits light in a wavelength other than the particular wavelength region, and thus the color purity of light transmitted through the color filter layer may be decreased in some cases. For example, a color filter layer with high transmittance, which is a maximum transmittance of 80% or more in the blue wavelength region, has a maximum transmittance of 5% or more in the wavelength region of from 570 nm to 760 nm in some cases. In addition, a color filter layer with high transmittance, which is a maximum transmittance of 75% or more in the green wavelength region, has a maximum transmittance of 10% or more in the wavelength region of from 380 nm to 450 nm in some cases. Accordingly, in order to inhibit reduction of color purity, a color filter layer with relatively low transmittance is preferably used.

However, the first light-emitting element 132a used in the display device in this embodiment is a light-emitting element with increased color purity of blue light emitted from the first light-emitting layer, by adjusting an optical path length between the first reflective electrode 102a and the light-transmitting electrode 112 and utilizing interference of light. Therefore, the intensity of light in regions other than the blue wavelength region can be extremely lowered, and thus high color purity can be maintained even when the color filter layer 134a with high transmittance of light in the blue wavelength region is used. For example, as the color filter layer 134a, a color filter layer having a maximum transmittance of 80% or more in the blue wavelength region can be used. In this case, the color filter layer 134a may have a maximum transmittance of 5% or more in the wavelength region of 570 nm to 760 nm. This is because visible light of 570 nm or more is weakened by increasing the color purity of blue light from the first light-emitting layer with use of interference of light.

By applying the color filter layer 134a with high transmittance in this manner, light absorption by the color filter layer 134a can be reduced, which leads to improvement of use efficiency of light. In addition, in order that the transmittance of the color filter layer 134a in the blue wavelength region can be 80% or more, for example, the concentration of a coloring material contained may be low. Alternatively, the film thickness of the color filter layer 134a is decreased, and thereby, transmittance of light in the blue wavelength region may be increased.

In addition, in FIG. 1B, the color filter layer 134b preferably has a transmission center wavelength in the green wavelength region (for example, the transmission center wavelength is 550 nm), because light emitted from the second light-emitting element 132b can be output efficiently.

Similarly to the first light-emitting element 132a, the second light-emitting element 132b is a light-emitting element with increased color purity of green light emitted from the second light-emitting layer, and thus, even when the color filter layer 134b with high transmittance of light in the green wavelength region is used, high color purity can be maintained. For example, as the color filter layer 134b, a color filter layer with a maximum transmittance of 75% or more in the green wavelength region can be used. In this case, the color filter layer 134b may have a maximum transmittance of 10% or more in the wavelength region of 380 nm to 450 nm. This is because visible light of 450 nm or less is weakened by increasing the color purity of green light from the second light-emitting layer with use of interference of light.

By applying the color filter layer 134b with high transmittance of light in the green wavelength region in this manner, light absorption by the color filter layer 134b can be reduced, which leads to improvement of use efficiency of light. In addition, with use of the color filter layer 134b, the color purity of the second pixel 230b can be more increased, and thereby the color reproducibility of the display device can be improved.

In the example of FIG. 1B, the first pixel 230a and the second pixel 230b are each provided with a color filter layer, but the embodiment of the present invention is not limited to the example, and either the first pixel 230a or the second pixel 230b, and the third pixel 130c may be provided with color filter layers. Note that the resonant wavelength of the second light-emitting element 132b is longer than that of the first light-emitting element 132a. Thus a possibility of mixing colors of the second light-emitting element 132b, caused by the resonant wavelength of light exhibiting green color and that of light exhibiting blue color which are close to each other is higher than a possibility of mixing colors of the first light-emitting element 132a. Therefore, it is very effective to provide the color filter layer 134b in the second pixel 230b for more favorable green chromaticity.

In addition, as the resonant wavelength of the light-emitting element is shorter, color mixing hardly occurs. For that reason, a pixel for light with a short wavelength is preferably provided with a color filter layer with high transmittance. For example, the transmittance of light in the blue wavelength region of the color filter layer 134a provided for the first pixel 230a for blue (B) is preferably higher than that of the transmittance light in the green wavelength region of the color filter layer 134b provided for the second pixel 230b for green (G), and the transmittance light in the green wavelength region of the color filter layer 134b provided for the second pixel 230b for green (B) is preferably higher than that of the transmittance of light in the red wavelength region of the color filter layer 134c provided for the third pixel 130c for red (R). The display device with such a structure can achieve both high color purity and low power consumption.

The display device illustrated in FIG. 1B can prevent reflection of external light in the display portion and have an increased contrast by provision of a color filter layer in each pixel. In addition, a color filter layer with high transmittance is provided for each of the first pixel 230a and the second pixel 230b for emission color of light with a relatively short wavelength, and thus the display device can consume low power as well as maintain color reproducibility.

Figure 2:
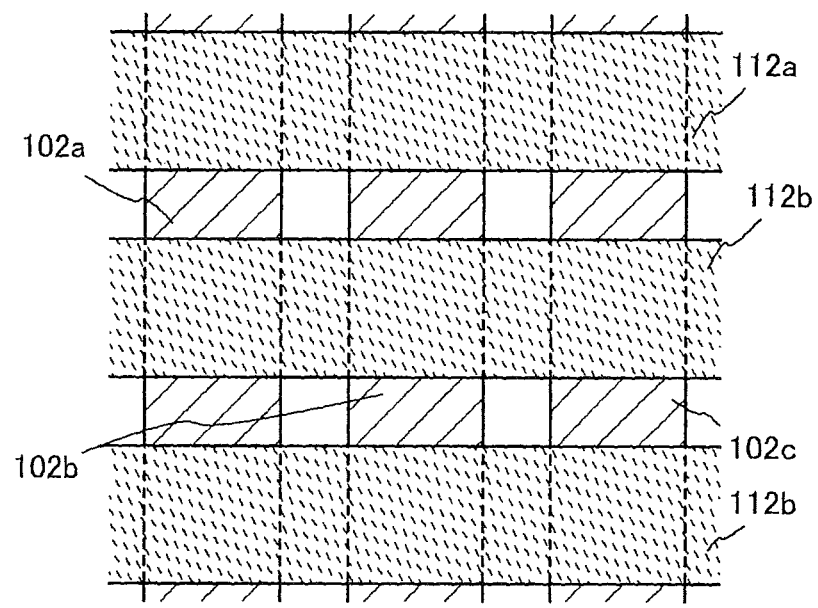
FIG. 2 illustrates a light-emitting element which can be applied to one embodiment of the present invention.

FIG. 2 is a plane view illustrating an electrode structure in the display portion in the display device of this embodiment. Note that in FIG. 2, for easy understanding, some parts (e.g., a second EL layer) of components are not illustrated. The display device in FIG. 2 is a passive matrix display device where the reflective electrodes 102 (the first reflective electrode 102a, the second reflective electrode 102b, and the third reflective electrode 102c) provided in a stripe pattern and the light-transmitting electrodes 112 (the first light-transmitting electrode 112a, the second light-transmitting electrode 112b, and the third light-transmitting electrode 112c) provided in a stripe pattern are stacked in a lattice pattern.

The EL layers included in the first light-emitting element 132a, the second light-emitting element 132b, and the third light-emitting element 132c are each continuous which is provided entirely between the reflective electrodes 102 and the light-transmitting electrodes 112. Therefore, the light-emitting elements are not needed to be formed separately with use of metal masks, and a high-definition display device can be provided. For example, the horizontal definition can be 350 ppi or more, preferably 400 ppi or more.

Figure 3A:
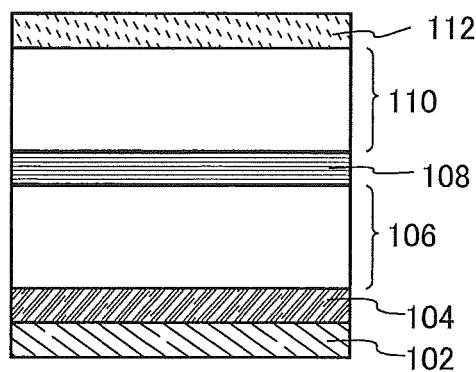
FIGS. 3A to 3C each illustrate a light-emitting element in accordance with one embodiment of the present invention.
Figure 3B:
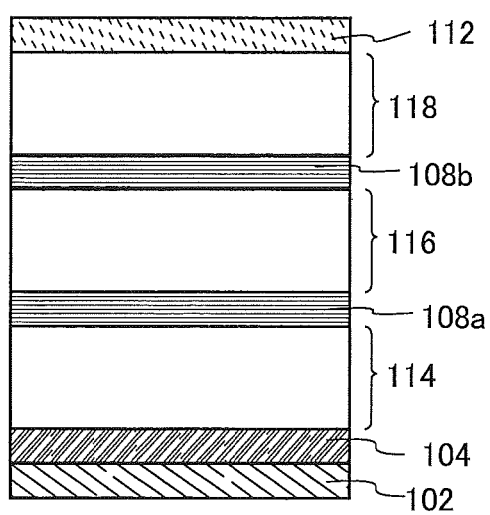
Figure 3C:
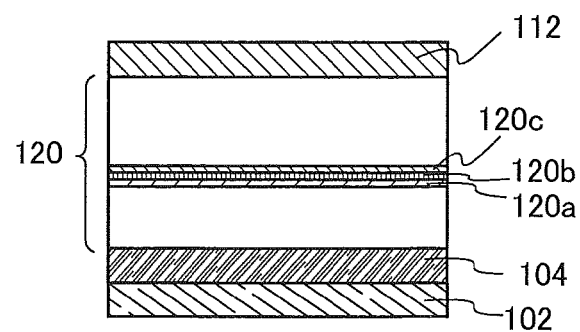

FIGS. 3A to 3C illustrate structural examples of light-emitting elements which can be applied to the display device in this embodiment.

A light-emitting element illustrated in FIG. 3A includes the reflective electrode 102, the light-transmitting conductive layer 104, the first EL layer 106, the charge-generation layer 108, the second EL layer 110, and the light-transmitting electrode 112.

In the first light-emitting element 132a, the second light-emitting element 132b, the third light-emitting element 132c, the reflective electrodes 102 (the first reflective electrode 102a, the second reflective electrode 102b, and the third reflective electrode 102c) are each provided on the side opposite to the direction where light is output and are each formed using a reflective material.

As such a reflective material, a metal material such as aluminum, gold, platinum, silver, nickel, tungsten, chromium, molybdenum, iron, cobalt, copper, or palladium can be used. In addition, any of the following can be used: alloys containing aluminum (aluminum alloys) such as an alloy of aluminum and titanium, an alloy of aluminum and nickel, and an alloy of aluminum and neodymium; and an alloy containing silver such as an alloy of silver and copper. An alloy of silver and copper is preferable because of its high heat resistance. Further, a metal film or a metal oxide film is stacked on and in contact with an aluminum alloy film, whereby oxidation of the aluminum alloy film can be prevented. As examples of a material for the metal film or the metal oxide film, titanium, titanium oxide, and the like are given. Further, the above materials are preferable, because they are present in large amounts in the Earth's crust and inexpensive to achieve a reduction in the cost of manufacturing a light-emitting element.

In the example of this embodiment, the reflective electrodes 102 are used as the anodes of the light-emitting elements. However, the embodiment of the present invention is not limited to this structure.

The light-transmitting conductive layers 104 (the first light-transmitting conductive layer 104a, the second light-transmitting conductive layer 104b, and the third light-transmitting conductive layer 104c) are each formed using a material capable of transmitting visible light as a single layer or a stacked-layer. For example, as such a material having a light-transmitting property, indium oxide, indium tin oxide, indium zinc oxide, zinc oxide, and zinc oxide to which gallium is added, graphene, or the like can be used.

In addition, the light-transmitting conductive layers 104 can be formed with the use of a conductive composition containing a conductive high molecule (also referred to as a conductive polymer). As the conductive high molecule, a so-called n-electron conjugated conductive high molecule can be used. For example, polyaniline or a derivative thereof, polypyrrole or a derivative thereof, polythiophene (PEDOT) or a derivative thereof, a copolymer of two or more kinds of aniline, pyrrole, and thiophene or a derivative thereof, and the like can be given.

In the first light-emitting element 132a, the second light-emitting element 132b, and the third light-emitting element 132c, the reflective electrodes 102 and the light-transmitting conductive layers 104 can each be processed into a desired shape by a photolithography process and an etching process. Thus, a minute pattern can be formed with good controllability, and thus a high-definition display device can be provided.

In addition, the light-transmitting conductive layer 104 is independently provided for each pixel, and thereby crosstalk can be prevented even when the film thickness of the light-transmitting conductive layer 104 is very large or the conductivity of the light-transmitting conductive layer 104 is high.

The first EL layer 106 may include at least a light-emitting layer. In this embodiment, the first EL layer 106 includes the first light-emitting layer having a maximum emission peak in the blue wavelength region. In addition, the first EL layer 106 can have a stacked structure in which a layer containing a substance having a high electron-transport property, a layer containing a substance having a high hole-transport property, a layer containing a substance having a high hole-injection property, a layer containing a substance having a high electron-injection property, a layer containing a bipolar substance (a substance having a high electron-transport property and a high hole-transport property), and the like are combined as appropriate, in addition to the light-emitting layer. A plurality of light-emitting layers may be included.

For example, the first EL layer 106 may have a stacked-structure in which a hole-injection layer, a hole-transport layer, the first light-emitting layer, an electron-transport layer, and an electron-injection layer are stacked. Needless to say, when the reflective electrode 102 is used as a cathode, the electron-injection layer, the electron-transport layer, the first light-emitting layer, the hole-transport layer, and the hole-injection layer may be stacked in this order over the reflective electrode 102.

The hole-injection layer is a layer having a high hole-injection property. As the substance having a high hole-injection property, for example, metal oxides such as molybdenum oxide, titanium oxide, vanadium oxide, rhenium oxide, ruthenium oxide, chromium oxide, zirconium oxide, hafnium oxide, tantalum oxide, silver oxide, tungsten oxide, and manganese oxide can be used. A phthalocyanine-based compound such as phthalocyanine (abbreviation: $H_2Pc$), or copper(II) phthalocyanine (abbreviation: CuPc) can also be used.

Alternatively, the following aromatic amine compounds which are low molecular organic compounds can be used: 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), or the like.

Further alternatively, any of high molecular compounds (e.g., oligomers, dendrimers, or polymers) can be used. Examples of high molecular compounds include poly(N-vinylcarbazole) (abbreviation: PVK), poly(4-vinyltriphenylamine) (abbreviation PVTPA), poly[N-(4-{N'-[4-(4-diphenylamino)phenyl]phenyl-N-phenylamino}phenyl)methacrylamide] (abbreviation PTPDMA), and poly[N,N'-bis(4-butylphenyl)-N,N'-bis(phenyl)benzidine (abbreviation: Poly-TPD). A high molecular compound to which acid is added, such as poly(3,4-ethylenedioxythiophene)/poly(styrenesulfonic acid) (PEDOT/PSS), or polyaniline/poly(styrenesulfonic acid) (PAni/PSS), can also be used.

In particular, for the hole-injection layer, a composite material in which an acceptor substance is mixed with an organic compound having a high hole-transport property is preferably used. With the use of the composite material in which an acceptor substance is added to a substance having a high hole-transport property, excellent hole injection from the anode can be obtained, which results in a reduction in the drive voltage of the light-emitting element. Such a composite material can be formed by co-evaporation of a substance having a high hole-transport property and a substance having an acceptor property. The hole-injection layer is formed using the composite material, whereby hole injection from the anode to the first EL layer 106 is facilitated.

As the organic compound for the composite material, various compounds such as aromatic amine compounds, carbazole derivatives, aromatic hydrocarbon, and high molecular compounds (such as oligomer, dendrimer, and polymer) can be used. Such an organic compound used for the composite material is preferably an organic compound having a high hole-transport property. Specifically, a substance having a hole mobility of $10^{-6}$ $cm^2/Vs$ or higher is preferably used. However, other substances than the above described materials may also be used as long as the substances have higher hole-transport properties than electron-transport properties. Such organic compounds which can be used for the composite material will be specifically shown below.

Examples of the organic compounds that can be used for the composite material include: aromatic amine compounds such as TDATA, MTDATA, DPAB, DNTPD, DPA3B, PCzPCA1, PCzPCA2, PCzPCN1, 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4, 4'-diamine (abbreviation: TPD), and 4-phenyl-4'-(9-phenyl-fluoren-9-yl)triphenylamine (abbreviation: BPAFLP); and carbazole derivatives such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 9-phenyl-3-[4-(10-phenyl-9-anthryl)phenyl]-9H-carbazole (abbreviation: PCzPA), and 1,4-bis[4-(N-carbazolyl)phenyl]-2,3,5,6-tetraphenylbenzene.

In addition, it is possible to use the following aromatic hydrocarbon compounds: 2-tert-butyl-9,10-di(2-naphthyl) anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di (2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl)-2-tert-butylanthracene, 9,10-bis[2-(1-naphthyl)phenyl]anthracene, 2,3,6,7-tetramethyl-9,10-di(1-naphthyl)anthracene, or the like.

Further alternatively, an aromatic hydrocarbon compound such as 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-b is [(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), or 9,10-bis[4-(2,2-diphenylvinyl)phenyl] anthracene (abbreviation: DPVPA) can be used.

Further, as an electron acceptor, organic compounds such as 7,7,8,8-tetracyano-2,3,5,6-tetrafluoroquinodimethane (abbreviation: $F_4$-TCNQ) and chloranil; and transition metal oxides can be given. In addition, oxides of metals belonging to Groups 4 to 8 in the periodic table can be also given. Specifically, vanadium oxide, niobium oxide, tantalum oxide, chromium oxide, molybdenum oxide, tungsten oxide, manganese oxide, and rhenium oxide are preferable since their electron-accepting properties are high. Among these, molybdenum oxide is especially preferable since it is stable in the air and its hygroscopic property is low and is easily treated.

Note that the hole-injection layer may be formed using a composite material of a high molecular compound such as PVK, PVTPA, PTPDMA, or Poly-TPD and an electron acceptor described above.

In addition, when a layer containing a composite material described above is provided for the first EL layer 106, the optical path length may be adjusted by controlling the film thickness of the layer containing a composite material. In this case, the first light-transmitting conductive layer 104a is not necessarily provided.

The hole-transport layer is a layer that contains a substance with a high hole-transport property. As the substance having a high hole-transport property, any of the following aromatic amine compounds can be used, for example: NPB; TPD; BPAFLP; 4,4=-bis[N-(9,9-dimethylfluoren-2-yl)-N-phenylamino]biphenyl (abbreviation: DFLDPBi); and 4,4'-bis[N-(spiro-9,9'-bifluoren-2-yl)-N-phenylamino]biphenyl (abbreviation: BSPB). The substances mentioned here are mainly ones that have a hole mobility of $10^{-6}$ cm$^2$/V·s or higher. However, other substances than the above described materials may also be used as long as the substances have higher hole-transport properties than electron-transport properties. The layer containing a substance with a high hole-transport property is not limited to a single layer, and two or more layers containing the aforementioned substances may be stacked.

For the hole-transport layer, a carbazole derivative such as CBP, CzPA, or PCzPA or an anthracene derivative such as t-BuDNA, DNA, or DPAnth may be used.

Further alternatively, for the hole-transport layer, a high molecular compound such as PVK, PVTPA, PTPDMA, or Poly-TPD can be used.

The first light-emitting layer is a layer containing a light-emitting organic compound having a maximum emission peak in the blue wavelength region. As the light-emitting organic compound, for example, a fluorescent compound which exhibits fluorescence or a phosphorescent compound which exhibits phosphorescence can be used.

Examples of a fluorescent compound for blue that can be used for the first light-emitting layer N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(10-phenyl-9-anthryl)-4'-(9-phenyl-9H-carbazol-3-yl) triphenylamine (abbreviation: PCBAPA), and the like.

As examples of the phosphorescent compound for blue that can be used for the first light-emitting layer, the following materials are given: bis[2-(4',6'-difluorophenyl) pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium (III) picolinate (abbreviation: Ir(CF$_3$ppy)$_2$(pic)), bis[2-(4',6'-difluorophenyl)pyridinato-N,C$^{2'}$]iridium(III) acetylacetonate (abbreviation: FIr(acac)), and the like.

Note that the first light-emitting layer may have a structure in which the above light-emitting organic compound (a guest material) is dispersed in another substance (a host material). As such a host material, various kinds of materials can be used, and it is preferable to use a substance which has a lowest unoccupied molecular orbital level (LUMO level) higher than the light-emitting substance and has a highest occupied molecular orbital level (HOMO level) lower than that of the light-emitting substance.

As specific examples of the host material that can be used for the light-emitting element in this embodiment, the following are given: metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato) aluminum(III) (abbreviation: BAlq), bis(8-quinolinolato) zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis [5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1, 3,5-benzenetriyl)tris(1-phenyl-1H-benzimidazole) (abbreviation: TPBI), bathophenanthroline (abbreviation: BPhen), and bathocuproine (BCP); condensed aromatic compounds such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation:

BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3"-(benzene-1,3,5-triyl)tripyrene (abbreviation: TPB 3), 9,10-diphenylanthracene (abbreviation: DPAnth), and 6,12-dimethoxy-5,11-diphenylchrysene; aromatic amine compounds such as N,N-dipheyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB (or α-NPD), TPD, DFLDPBi, and BSPB; and the like.

Alternatively, as the host material, plural kinds of materials can be used. For example, in order to suppress crystallization, a substance such as rubrene which can suppress crystallization, may be further added. In addition, NPB, Alq, or the like may be further added in order to efficiently transfer energy to the guest material.

When the structure in which a guest material is dispersed in a host material is employed, crystallization of the first light-emitting layer can be suppressed. Further, concentration quenching due to high concentration of the guest material can be inhibited.

A high molecular compound can be used for the first light-emitting layer. Specifically, as a light-emitting material which exhibits blue light emission, the following can be used: poly(9,9-dioctylfluorene-2,7-diyl) (abbreviation: PFO), poly[(9,9-dioctylfluorene-2,7-diyl-co-(2,5-dimethoxybenzene-1,4-diyl)] (abbreviation: PF-DMOP), poly{(9,9-dioctylfluorene-2,7-diyl)-co-[N,N'-di-(p-butylphenyl)-1,4-diaminobenzene]} (abbreviation: TAB-PFH), and the like.

The electron-transport layer is a layer that contains a substance with a high electron-transport property. As the substance having a high electron-transport property, any of the following substances can be used, for example: a metal complex having a quinoline skeleton or a benzoquinoline skeleton such as tris(8-quinolinolato)aluminum (abbreviation: Alq), tris(4-methyl-8-quinolinolato)aluminum (abbreviation: Almq$_3$), bis(10-hydroxybenzo[h]-quinolinato)beryllium (abbreviation: BeBq$_2$), or bis(2-methyl-8-quinolinolato)(4-phenylphenolato)aluminum (abbreviation: BAlq). Alternatively, a metal complex or the like including an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$) can be used. Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The substances mentioned here are mainly ones that have an electron mobility of $10^{-6}$ cm$^2$/V·s or higher. Furthermore, the electron-transport layer is not limited to a single layer, and may have a stack structure of two or more layers made of the aforementioned substances.

The electron-injection layer is a layer including a high electron-injection substance. For the electron-injection layer, an alkali metal, an alkaline-earth metal, or a compound thereof, such as lithium, cesium, calcium, lithium fluoride, cesium fluoride, calcium fluoride, or lithium oxide, can be used. In addition, a rare earth metal compound such as erbium fluoride can also be used. Further, any of the above substances which can form the electron-transport layer can be used.

The charge-generation layer 108 has a function of injecting holes to the EL layer on the cathode side and injecting electrons to the EL layer on the anode side when a voltage is applied to the light-emitting element and charges are generated.

The charge-generation layer 108 can be formed by using any of the above-mentioned composite materials. Further, the charge-generation layer 108 may have a stacked structure including a layer containing a composite material and a layer containing another material. In that case, as the layer containing another material, a layer containing an electron-donating substance and a substance with a high electron-transport property, a layer formed of a transparent conductive film, or the like can be used. As for a light-emitting element having such a structure, problems such as energy transfer and quenching hardly occur, and a light-emitting element which has both high light emission efficiency and long lifetime can be easily obtained due to expansion in the choice of materials. Moreover, a light-emitting element which provides phosphorescence from one of the EL layers and fluorescence from the other of the EL layers can be readily obtained.

When the charge-generation layer is arranged between the EL layers stacked as illustrated in FIG. 3A, the element can have high luminance and a long lifetime while the current density is kept low. In addition, the voltage drop due to resistance of the electrode material can be suppressed, whereby uniform light emission in a large area is possible.

By adjustment of the film thickness of the charge-generation layer 108, it is also possible that the optical path length between the first reflective electrode 102a and the light-transmitting electrode 112 is adjusted. In this case, the first light-transmitting conductive layer 104a is not necessarily provided.

The second EL layer 110 may include at least a light-emitting layer. In this embodiment, the second EL layer 110 includes the second light-emitting layer having a maximum emission peak in the green wavelength region and the third light-emitting layer having a maximum emission peak in the red wavelength region. In addition, the second EL layer 110 can have a stacked structure in which a layer containing a substance having a high hole-transport property, a layer containing a substance having a high electron-transport property, a layer containing a substance having a high hole-injection property, a layer containing a substance having a high electron-injection property, a layer containing a bipolar substance (a substance having high electron-transport and high hole-transport properties), and the like are combined as appropriate, in addition to the light-emitting layer. In addition, the second EL layer 110 may have a structure similar to the first EL layer 106 or a stacked structure different from that of the first EL layer. For example, the second EL layer 110 may have a stacked structure in which a hole-injection layer, a hole-transport layer, the second light-emitting layer, the third light-emitting layer, an electron-transport layer, an electron-injection buffer layer, an electron-relay layer, and a composite material layer in contact with the light-transmitting electrode 112 are stacked. Note that the second EL layer 110 may have three or more light-emitting layers.

The second light-emitting layer is a layer containing a light-emitting organic compound having a maximum emission peak in the green wavelength region. As the light-emitting organic compound, for example, a fluorescent compound which exhibits fluorescence or a phosphorescent compound which exhibits phosphorescence can be used.

As a fluorescent compound for green light that can be used for the second light-emitting layer, the following can be given: N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N, 9-diphenyl-9H-carbazol-3-amine (abbreviation: 2PCABPhA), N-(9,10-diphenyl-2-anthryl)-N,N,'N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracene-2-amine (abbreviation: 2YGABPhA), N,N,9-triphenylanthracen-9-amine (abbreviation: DPhAPhA), and the like.

Examples of such phosphorescent compounds for green light include tris(2-phenylpyridinato-N,$C^{2'}$)iridium(III) (abbreviation: Ir(ppy)$_3$), bis[2-phenylpyridinato-N,$C^{2'}$]iridium (III)acetylacetonate (abbreviation: Ir(ppy)$_2$(acac)), bis(1,2-diphenyl-1H-benzimidazolato)iridium(III)acetylacetonate (abbreviation: Ir(pbi)$_2$(acac)), bis(benzo[h]quinolinato)iridium(III)acetylacetonate (abbreviation: Ir(bzq)$_2$(acac)), and tris(benzo[h]quinolinato)iridium(III) (abbreviation: Ir(bzq)$_3$).

Note that the second light-emitting layer may have a structure in which the above light-emitting organic compound (a guest material) is dispersed in another substance (a host material), similarly to the first light-emitting layer.

In addition, a high molecular compound can be used as the light-emitting organic compound included in the second light-emitting layer. Specifically, as a light-emitting material which emits green light, the following can be used: poly(p-phenylenevinylene) (abbreviation: PPV), poly[(9,9-dihexyl-fluorene-2,7-diyl)-alt-co-(benzo[2,1,3]thiadiazole-4,7-diyl)] (abbreviation: PFBT), poly[(9,9-dioctyl-2,7-divinylenefluorenylene)-alt-co-(2-methoxy-5-(2-ethylhexyloxy)-1,4-phenylene)], and the like.

The third light-emitting layer is a layer containing a light-emitting organic compound that has a maximum emission peak in the red wavelength region. As the light-emitting organic compound, for example, a fluorescent compound which exhibits fluorescence or a phosphorescent compound which exhibits phosphorescence can be used.

As a fluorescent compound that emits red light, there are N,N,N',N'-tetrakis(4-methylphenyl)tetracene-5,11-diamine (abbreviation: p-mPhTD), 7,14-diphenyl-N,N,N',N'-tetrakis(4-methylphenyeacenaphtho[1,2-a]fluoranthene-3,10-diamine (abbreviation: p-mPhAFD), and the like.

In addition, as examples of phosphorescent compounds that emit orange light to red light, the following organometallic complexes are given: tris(2-phenylquinolinato-N,$C^{2'}$) iridium(III) (abbreviation: Ir(pq)$_3$), bis(2-phenylquinolinato-N,$C^{2'}$)iridium(III) acetylacetonate (abbreviation: Ir(pq)$_2$(acac)), (acetylacetonato)bis(3,5-dimethyl-2-phenylpyrazinato)iridium(III) (abbreviation: Ir(mppr-Me)$_2$ (acac)), (acetylacetonato)bis(5-isopropyl-3-methyl-2-phenylpyrazinato)iridium(III) (abbreviation: Ir(mppr-iPr)$_2$ (acac)), bis[2-(2'-benzo[4,5-a]thienyl)pyridinato-N,$C^{3'}$] iridium (III)acetylacetonate (abbreviation: Ir(btp)$_2$(acac)), bis(1-phenylisoquinolinato-N,$C^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$ (acac)), (dipivaloylmethanato)bis(2,3,5-triphenylpyrazinato)iridium(III) (abbreviation: Ir(tppr)$_2$ (dpm)), and (2,3,7,8,12,13,17,18-octaethyl-21H,23H-porphine)platinum(II) (abbreviation: PtOEP).

Note that the third light-emitting layer may have a structure in which a light-emitting organic compound (a guest material) described above is dispersed in another substance (a host material), similarly to the first light-emitting layer and the second light-emitting layer.

In addition, a high molecular compound can be used as a light-emitting organic compound included in the third light-emitting layer. Specifically, as a material for orange to red light emission, the following can be used: poly[2-methoxy-5-(2'-ethylhexoxy)-1,4-phenylenevinylene] (abbreviation: MEH-PPV), poly(3-butylthiophene-2,5-diyl) (abbreviation: R4-PAT), poly{[9,9-dihexyl-2,7-bis(1-cyanovinylene)fluorenylene]-alt-co-[2,5-bis(N,N'-diphenyl amino)-1,4-phenylene]}, poly {[2-methoxy-5-(2-ethylhexyloxy)-1,4-bis(1-cyanovinylenephenylene)]-alt-co-[2,5-bis(N,N'-diphenylamino)-1,4-phenylene]} (abbreviation: CN-PPV-DPD), and the like.

In the second EL layer 110, it is preferable to provide a composite material layer in contact with the light-transmitting electrode 112, because damages to the second EL layer 110 can be reduced especially when the light-transmitting electrode 112 is formed by a sputtering method. The composite material layer can be formed using a composite material described above in which an acceptor substance is mixed with an organic compound having a high hole-transport property.

Further, with use of an electron-injection buffer layer, an injection barrier between the composite material layer and the electron-transport layer can be lowered; thus, electrons generated in the composite material layer can be easily injected into the electron-transport layer.

Any of the following substances having high electron injection properties can be used for the electron injection buffer layer: an alkali metal, an alkaline earth metal, a rare earth metal, a compound of such metal (including an alkali metal compound (e.g., an oxide such as lithium oxide, a halide, and carbonate such as lithium carbonate or cesium carbonate), an alkaline earth metal compound (including an oxide, a halide, and carbonate), a rare earth metal compound (including an oxide, a halide, and carbonate), and the like.

Further, in the case where the electron-injection buffer layer contains a substance having a high electron-transport property and a donor substance, the donor substance is preferably added so that the mass ratio of the donor substance to the substance having a high electron-transport property ranges from 0.001:1 to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, a compound of such metal (e.g., an alkali metal compound (including an oxide of lithium oxide or the like, a halide, and carbonate such as lithium carbonate or cesium carbonate), an alkaline earth metal compound (including an oxide, a halide, and carbonate), and a rare earth metal compound (including an oxide, a halide, and carbonate). Note that as the highly electron-transport substance, a material similar to the above-described materials for the electron-transport layer can be used.

Furthermore, an electron-relay layer is preferably formed between the electron-injection buffer layer and the composite material layer. The electron-relay layer is not necessarily provided; however, by providing the electron-relay layer having a high electron-transport property, electrons can be rapidly transported to the electron-injection buffer layer.

The structure in which the electron-relay layer is sandwiched between the composite material layer and the electron-injection buffer layer is a structure in which the acceptor substance contained in the composite material layer and the donor substance contained in the electron-injection buffer layer are less likely to interact with each other, and thus their functions hardly interfere with each other. Accordingly, an increase in the driving voltage can be prevented.

The electron-relay layer contains a substance having a high electron-transport property and is formed such that the LUMO level of the substance having a high electron-transport property is located between the LUMO level of the acceptor substance contained in the composite material layer and the LUMO level of the substance having a high electron-transport property contained in the electron-transport layer. In the case where the electron-relay layer contains a donor substance, the donor level of the donor substance is controlled so as to be located between the LUMO level of the acceptor substance in the composite material layer and the LUMO level of the substance having a high electron-transport property contained in the electron-transport layer. As a specific value of the energy level, the LUMO level of the substance having a high electron-transport property contained in the electron-relay layer is preferably −5.0 eV or more, more preferably from −5.0 eV to −3.0 eV.

As the substance having a high electron-transport property contained in the electron-relay layer, a phthalocyanine-based material or a metal complex having a metal-oxygen bond and an aromatic ligand is preferably used.

As the phthalocyanine-based material contained in the electron-relay layer, specifically, any of the followings is preferably used: CuPc, phthalocyanine tin(II) complex (SnPc), phthalocyanine zinc complex (ZnPc), cobalt(II) phthalocyanine, β-form (CoPc), phthalocyanine iron (FePc), and vanadyl 2,9,16,23-tetraphenoxy-29H,31H-phthalocyanine (PhO-VOPc).

As the metal complex having a metal-oxygen bond and an aromatic ligand, which is contained in the electron-relay layer, a metal complex having a metal-oxygen double bond is preferably used. The metal-oxygen double bond has acceptor properties (properties of easily accepting electrons); thus, electrons can be transferred (donated and accepted) more easily. Further, the metal complex which has a metal-oxygen double bond is considered stable. Thus, the use of the metal complex having the metal-oxygen double bond makes it possible to drive the light-emitting element at low voltage more stably.

As a metal complex having a metal-oxygen bond and an aromatic ligand, a phthalocyanine-based material is preferable. Specifically, any of vanadyl phthalocyanine (VOPc), a phthalocyanine tin(IV) oxide complex (SnOPc), and a phthalocyanine titanium oxide complex (TiOPc) is preferable because a metal-oxygen double bond is more likely to act on another molecular in terms of a molecular structure and an acceptor property is high.

Note that as the phthalocyanine-based materials described above, a phthalocyanine-based material having a phenoxy group is preferable. Specifically, a phthalocyanine derivative having a phenoxy group, such as PhO-VOPc, is preferable. A phthalocyanine derivative having a phenoxy group is soluble in a solvent. A phthalocyanine derivative having a phenoxy group is soluble in a solvent. For that reason, such a phthalocyanine derivative has an advantage of being easily handled during formation of the light-emitting element and an advantage of facilitating maintenance of an apparatus used for forming a film.

The electron-relay layer may further contain a donor substance. Examples of the donor substance include organic compounds such as tetrathianaphthacene (abbreviation: TTN), nickelocene, and decamethylnickelocene, in addition to an alkali metal, an alkaline earth metal, a rare earth metal, and a compound of such metals (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)). When such a donor substance is contained in the electron-relay layer, electrons can be transferred easily and the light-emitting element can be driven at lower voltage.

In the case where a donor substance is contained in the electron-relay layer, in addition to the materials described above as the substance having a high electron-transport property, a substance having a LUMO level higher than the acceptor level of the acceptor substance contained in the composite material layer can be used. As a specific energy level, a LUMO level is −5.0 eV or more, preferably from −5.0 eV to −3.0 eV. As examples of such a substance, a perylene derivative and a nitrogen-containing condensed aromatic compound, and the like can be given. Note that a nitrogen-containing condensed aromatic compound is preferably used for the electron-relay layer because of its stability.

As specific examples of the perylene derivative, the following can be given: 3,4,9,10-perylenetetracarboxylicdianhydride (abbreviation: PTCDA), 3,4,9,10-perylenetetracarboxylic-bis-benzimidazole (abbreviation: PTCBI), N,N'-dioctyl-3,4,9,10-perylenetetracarboxylic diimide (abbreviation: PTCDI-C8H), N,N-dihexyl-3,4,9,10-perylenetetracarboxylic diimide (Hex PTC), and the like.

As specific examples of the nitrogen-containing condensed aromatic compound, the following can be given: pirazino[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: $HAT(CN)_6$), 2,3-diphenylpyrido[2,3-b]pyrazine (abbreviation: 2PYPR), 2,3-bis(4-fluorophenyl)pyrido[2,3-b]pyrazine (abbreviation: F2PYPR), and the like.

Besides, 7,7,8,8-tetracyanoquinodimethane (abbreviation: TCNQ), 1,4,5,8-naphthalenetetracarboxylicdianhydride (abbreviation: NTCDA), perfluoropentacene, copper hexadecafluoro phthalocyanine (abbreviation: $F_{16}CuPc$), N,N-bis(2,2,3,3,4,4,5,5,6,6,7,7,8,8,8-pentadecafluorooctyl)-1,4,5,8-naphthalenetetracar boxylic diimide (abbreviation: NTCDI-C8F), 3',4'-dibutyl-5,5''-bis(dicyanomethylene)-5,5''-dihydro-2,2':5',2''-terthiophene (abbreviation: DCMT), methanofullerene (e.g., [6,6]-phenyl $C_{61}$ butyric acid methyl ester), or the like can be used.

Note that in the case where a donor substance is contained in the electron-relay layer, the electron-relay layer may be formed by a method such as co-evaporation of a substance having a high electron-transport property and the donor substance.

The hole-injection layer, the hole-transport layer, and the electron-transport layer may be each formed using any of the above-described materials.

The light-transmitting electrode 112 is formed using a light-transmitting material because it is formed on the side where light is output. As a light-transmitting material, indium oxide, indium tin oxide, indium zinc oxide, zinc oxide, zinc oxide to which gallium is added, graphene, or the like can be used.

In addition, as the light-transmitting electrode 112, a metal material such as gold, platinum, nickel, tungsten, chromium, molybdenum, iron, cobalt, copper, palladium, or titanium can be used. Alternatively, a nitride of such a metal material (such as titanium nitride) or the like may be used. In the case of using such a metal material (or a nitride thereof), the light-transmitting electrode 112 may be thinned so as to be able to transmit light.

The element structure of a light-emitting element that can be applied to the display device in this embodiment is not limited to that in FIG. 3A. For example, two light-emitting layers may be stacked in the first EL layer 106, while one light-emitting layer may be formed in the second EL layer. Alternatively, as illustrated in FIG. 3B, the light-transmitting conductive layer 104, the first EL layer 114 including the first light-emitting layer, a first charge-generation layer 108a, the second EL layer 116 including a second light-emitting layer, a second charge-generation layer 108b, a third EL layer 118 including a third light-emitting layer, and the light-transmitting electrode 112 may be sequentially stacked over the reflective electrode 102.

Alternatively, as illustrated in FIG. 3C, the light-transmitting conductive layer 104, an EL layer 120 including a first light-emitting layer 120a, a second light-emitting layer 120b, and a third light-emitting layer 120c, the light-transmitting electrode 112 may be sequentially stacked over the reflective electrode 102. In addition, the light-emitting layers between the reflective electrode 112 and the light-transmitting electrode 102 may be stacked over the reflective electrode 102 in the order of the longest wavelength to the shortest wavelength (in other words, light emitted from the light-emitting layer provided on the reflective electrode 102 side has the longest wavelength).

The display device illustrated in this embodiment includes a plurality of pixels that have a light-emitting element in each of which light emitted from a light-emitting layer is resonated, between the reflective electrode 102 and the light-transmitting electrode 112, and has no color filter layers in pixels for light with relatively short wavelengths (for example, pixel for blue and/or pixel for green) or includes color filter layers with high transmittance in pixels for light with relatively short wavelengths (for example, pixel for blue and/or pixel for green) and a color filter layer selectively in a pixel for light with a long wavelength (for example, pixel for red). By such a structure, a display device that consumes less power, maintaining color reproducibility can be provided.

The structures described in this embodiment can be used in appropriate combination with any structure described in other embodiments.

Embodiment 2

In this embodiment, an active matrix display device that is one embodiment of the present invention will be described with reference to FIGS. 4A and 4B. FIG. 4A is a plan view illustrating a display device. FIG. 4B is a cross-sectional view taken along the lines A-B and C-D in FIG. 4A In the display device illustrated in FIGS. 4A and 4B, an element substrate 410 and a sealing substrate 404 are attached to each other with a sealant 405, and a driver circuit portion (a source side driver circuit 401 and a gate side driver circuit 403) and a pixel portion 402 including a plurality of pixels are provided.

Note that a wiring 408 is a wiring for transmitting signals that are to be inputted to the source side driver circuit 401 and the gate side driver circuit 403, and receives a video signal, a clock signal, a start signal, a reset signal, and the like from a flexible printed circuit (FPC) 409 which serves as an external input terminal. Although only the FPC is illustrated here, a printed wiring board (PWB) may be attached to the FPC. The display device in this specification includes not only a display device itself but also a display device to which an FPC or a PWB is attached.

The driver circuit portion (the source side driver circuit 401 and the gate side driver circuit 403) includes a plurality of transistors. A plurality of pixels included in the pixel portion 402 each include a switching transistor, a current controlling transistor, and a first electrode electrically connected to drain electrodes of the current controlling transistor and the switching transistor.

Although the driver circuit portion (the source side driver circuit 401 and the gate side driver circuit 403) and the pixel portion 402 are formed over the element substrate 410, FIG. 4B illustrates the source side driver circuit 401 which is included in the driver circuit portion and three pixels in the pixel portion 402.

The plurality of pixels in the pixel portion 402 include at least pixels for two colors. In this embodiment, an example is described in which pixels for three colors, a red (R) pixel 420a, a green (G) pixel 420b, and a blue (B) pixel 420c, are provided.

The pixels 420a, 420b, and 420c respectively include light-emitting elements 418a, 418b, and 418c and transistors 412a, 412b, and 412c which are respectively electrically connected to the light-emitting elements 418a, 418b, and 418c and function as switching transistors. In addition, the pixel 420c includes a color filter layer 434c overlapping with the light-emitting element 418c.

The light-emitting elements 418a, 418b, and 418c respectively include a stacked layer of a reflective electrode 413a and a light-transmitting conductive layer 415a, a stacked layer of a reflective electrode 413b and a light-transmitting conductive layer 415b, and a stacked layer of a reflective electrode 413c and a light-transmitting conductive layer 415c. In addition, the light-emitting elements 418a, 418b, and 418c include, over the respective stacked layers, a stacked layer of a first EL layer 431 in which a first light-emitting layer is provided, a charge-generation layer 432, and a second EL layer 433 in which a second light-emitting layer and a third light-emitting layer are provided, and a light-transmitting electrode 417.

By adjusting the film thickness of each of the light-transmitting conductive layers 415a, 415b, and 415c, in the pixel 420a for blue (B), blue light emitted from the first light-emitting layer is resonated between the reflective electrode 413a and the light-transmitting electrode 417; in the pixel 420b for green (G), green light emitted from the second light-emitting layer is resonated between the reflective electrode 413b and the light-transmitting electrode 417; and in the pixel 420c for red (R), red light emitted from the third light-emitting layer is resonated between the reflective electrode 413c and the light-transmitting electrode 417.

In addition, as the color filter layer 434c, a color filter layer having a transmission center wavelength in the red wavelength region can be used.

In accordance with the emission color of light emitted from each light-emitting layer, the optical path length between the reflective electrode and the light-transmitting electrode is optimized, and thereby, light of each color with high color purity can be output with high emission efficiency. In addition, by selective provision of the color filter layer 434c only in the pixel for red (R), low power consumption and high color reproducibility of the display device can be achieved. In addition, light-emitting layers are formed with a continuous film, instead of separately being formed in every pixel with use of metal masks, which does not result in reduction in yield and process complication due to the use of the metal masks.

A CMOS circuit, which is a combination of an n-channel transistor 423 and a p-channel transistor 424, is formed for the source side driver circuit 401. The driver circuit may be any of a variety of circuits formed with transistors, such as a CMOS circuit, a PMOS circuit, or an NMOS circuit. Although the example in which the source side driver circuit and the gate side driver circuit are fainted over a substrate is described in this embodiment, one embodiment of the present invention is not limited thereto. All or part of the source side driver circuit and the gate side driver circuit may be formed outside a substrate, not over the substrate.

Note that an insulator 414 is formed to cover end portions of the reflective electrodes 413*a*, 413*b*, and 413*c* and end portions of the light-transmitting conductive layers 415*a*, 415*b*, and 415*c*.

In order to improve the coverage, the insulator 414 is provided such that either an upper end portion or a lower end portion of the insulator 414 has a curved surface with a curvature. For example, when positive photosensitive acrylic is used as a material for the insulator 414, only an upper end portion of the insulator 414 preferably has a curved surface with a radius of curvature (0.2 μm to 3 μm). For the insulator 414, it is also possible to use either a negative type that becomes insoluble in an etchant by light irradiation or a positive type that becomes soluble in an etchant by light irradiation. Here, the insulator 414 is formed using a positive photosensitive acrylic resin film.

Materials of the color filter layer 434*c*, the reflective electrodes 413*a*, 413*b*, 413*c* and the light-transmitting conductive layers 415*a*, 415*b*, 415*c*, the first EL layer 431, the charge-generation layer 432, the second EL layer 433, and the light-transmitting electrode 417 can be the materials described in Embodiment 1.

The sealing substrate 404 is attached to the element substrate 410 with the sealant 405; thus, light-emitting elements 418 (418*a*, 418*b*, and 418*c*) are provided in a space 407 enclosed by the element substrate 410, the sealing substrate 404, and the sealant 405. Note that the space 407 is filled with a filler and may be filled with an inert gas (e.g., nitrogen or argon), an organic resin, or the sealant 405. A substance having a hygroscopic property may be used for the organic resin and the sealant 405.

Note that an epoxy-based resin is preferably used as the sealant 405. It is preferable that such a material allows as little moisture and oxygen as possible to penetrate. As a material for the sealing substrate 404, a glass substrate, a quartz substrate, or a plastic substrate made of fiberglass-reinforced plastics (FRP), polyvinyl fluoride (PVF), polyester, acrylic, or the like can be used.

As in this embodiment, an insulating film 411 which serves as a base film may be provided between the element substrate 410 and a semiconductor layer of the transistor. The insulating film has a function of preventing diffusion of an impurity element from the element substrate 410 and can be formed to have a single-layer structure or a stacked-layer structure using one or more of a silicon nitride film, a silicon oxide film, a silicon nitride oxide film, and a silicon oxynitride film.

There is no particular limitation on the structure of the transistor which can be used in the display device disclosed in this specification; for example, a staggered type transistor or a planar type transistor having a top-gate structure or a bottom-gate structure can be used. The transistor may have a single-gate structure in which one channel formation region is formed, a double-gate structure in which two channel formation regions are formed, or a triple-gate structure in which three channel formation regions are formed. Alternatively, the transistor may have a dual-gate structure including two gate electrode layers positioned over and below a channel region with a gate insulating layer therebetween.

The gate electrode layers can be formed to have a single-layer or stacked-layer structure using a metal material such as molybdenum, titanium, chromium, tantalum, tungsten, aluminum, copper, neodymium, or scandium, or an alloy material containing any of these materials as its main component.

For example, as a two-layer structure of the gate electrode layer, the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, and a two-layer structure of a titanium nitride layer and a molybdenum layer. As a three-layer structure, a three-layer structure in which a tungsten layer or a tungsten nitride layer, an alloy layer of aluminum and silicon or an alloy layer of aluminum and titanium, and a titanium nitride layer or a titanium layer are stacked is preferable.

The gate insulating layer can be formed to have a single-layer structure or a stacked-layer structure using a silicon oxide layer, a silicon nitride layer, a silicon oxynitride layer, and/or a silicon nitride oxide layer by a plasma CVD method, a sputtering method, or the like. Alternatively, a silicon oxide layer formed by a CVD method using an organosilane gas can be used as the gate insulating layer. As an organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$) can be used.

A material of the semiconductor layer is not particularly limited and may be determined as appropriate in accordance with the characteristics needed for the transistors 412*a*, 412*b*, 412*c*, 423, and 424. Examples of materials which can be used for the semiconductor layer will be given.

As the material of the semiconductor layer, any of the following can be used: an amorphous semiconductor formed by a sputtering method or a vapor-phase growth method using a semiconductor material gas typified by silane or germane; a polycrystalline semiconductor formed by crystallizing the amorphous semiconductor with the use of light energy or thermal energy; and a microcrystalline semiconductor. The semiconductor layer can be formed by a sputtering method, an LPCVD method, a plasma CVD method, or the like.

A single crystal semiconductor such as silicon or silicon carbide can be used for the semiconductor layer. When a single crystal semiconductor is used for the semiconductor layer, the size of the transistor can be reduced; thus, higher resolution pixels in a display portion can be obtained. In the case where a single crystal semiconductor is used for the semiconductor layer, an SOI substrate in which a single crystal semiconductor layer is provided can be used. Alternatively, a semiconductor substrate such as a silicon wafer may be used.

A typical example of an amorphous semiconductor is hydrogenated amorphous silicon, and a typical example of a crystalline semiconductor is polysilicon and the like. Examples of polysilicon (polycrystalline silicon) include so-called high-temperature polysilicon which contains polysilicon formed at a process temperature of 800° C. or higher as its main component, so-called low-temperature polysilicon which contains polysilicon formed at a process temperature of 600° C. or lower as its main component, and polysilicon obtained by crystallizing amorphous silicon with the use of e.g., an element that promotes crystallization. Needless to say, a microcrystalline semiconductor or a semiconductor partly containing a crystal phase can be used as described above.

Further, an oxide semiconductor may be used. As the oxide semiconductor, the following can be used: an oxide of four metal elements such as an In—Sn—Ga—Zn—O-based oxide semiconductor; an oxide of three metal elements such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor; or an oxide of two metal elements such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or In—Ga—O-based oxide semiconductor; an In—O-based oxide semiconductor; a Sn—O-based oxide semiconductor; or a Zn—O-based oxide semiconductor. Further, $SiO_2$ may be contained in the above oxide semiconductor. Here, for example, an In—Ga—Zn—O-based oxide semiconductor is an oxide containing at least In, Ga, and Zn, and the composition ratio of the elements is not particularly limited. The In—Ga—Zn—O-based oxide semiconductor may contain an element other than In, Ga, and Zn.

A thin film expressed by a chemical formula of $InMO_3(ZnO)_m$, (m>0) can be used for the oxide semiconductor layer. Here, M represents one or more metal elements selected from Ga, Al, Mn, and Co. For example, M can be Ga, Ga and Al, Ga and Mn, Ga and Co, or the like.

In the case where an In—Zn—O-based material is used as the oxide semiconductor, the atomic ratio thereof is In/Zn=0.5 to 50, preferably In/Zn=1 to 20, further preferably In/Zn=1.5 to 15. When the atomic ratio of Zn is in the above preferred range, the field-effect mobility of a transistor can be improved. Here, when the atomic ratio of the compound is In:Zn:O=X:Y:Z, the relation of Z>1.5X+Y is satisfied.

As the oxide semiconductor layer, an oxide semiconductor including a crystal with c-axis aligned (also referred to as a c-axis aligned crystal (CAAC)), which is neither completely single crystal nor completely amorphous, can be used.

As examples of materials for a wiring layer serving as a source electrode layer or a drain electrode layer, the following are given: an element selected from the group of Al, Cr, Ta, Ti, Mo, and W; an alloy containing any of the above elements as its component; an alloy film containing a combination of any of these elements; and the like. In the case where heat treatment is performed, a conductive film preferably has heat resistance high enough to withstand the heat treatment. Since the use of Al alone brings disadvantages such as low heat resistance and a tendency for corrosion, aluminum is used in combination with a conductive material having heat resistance. As such a conductive material having heat resistance, which is combined with Al, it is possible to use an element selected from the group of titanium (Ti), tantalum (Ta), tungsten (W), molybdenum (Mo), chromium (Cr), neodymium (Nd), and scandium (Sc), an alloy containing any of these elements as its component, an alloy containing a combination of any of these elements, or a nitride containing any of these elements as its component.

An inorganic insulating film or an organic insulating film formed by a dry method or a wet method can be used for an insulating film 419 which covers the transistors. For example, a silicon nitride film, a silicon oxide film, a silicon oxynitride film, an aluminum oxide film, a tantalum oxide film, or a gallium oxide film which is formed by a CVD method, a sputtering method, or the like can be used. Alternatively, an organic material such as polyimide, acrylic, benzocyclobutene, polyamide, or an epoxy resin can be used. Other than the above organic materials, a low-dielectric constant material (a low-k material), a siloxane-based resin, PSG (phosphosilicate glass), BPSG (borophosphosilicate glass), or the like can be used.

Note that the siloxane-based resin corresponds to a resin including a Si—O—Si bond formed using a siloxane-based material as a starting material. The siloxane-based resin may include, as a substituent, an organic group (e.g., an alkyl group or an aryl group) or a fluoro group. The organic group may include a fluoro group. A siloxane-based resin is applied by a coating method and baked; thus, the insulating film 419 can be formed.

Note that the insulating film 419 may be formed by stacking a plurality of insulating films formed using some of the above-described materials. For example, a structure may be employed in which an organic resin film is stacked over an inorganic insulating film.

In the above manner, the active matrix display device including the light-emitting element in accordance with one embodiment of the present invention can be obtained.

Note that this embodiment can be freely combined with any of the other embodiments.

Embodiment 3

In this embodiment, a display device that is capable of three-dimensional (3D) image display and uses the display device in any of the above-described embodiments as its display panel will be described with reference to drawings.

Figure 5A:
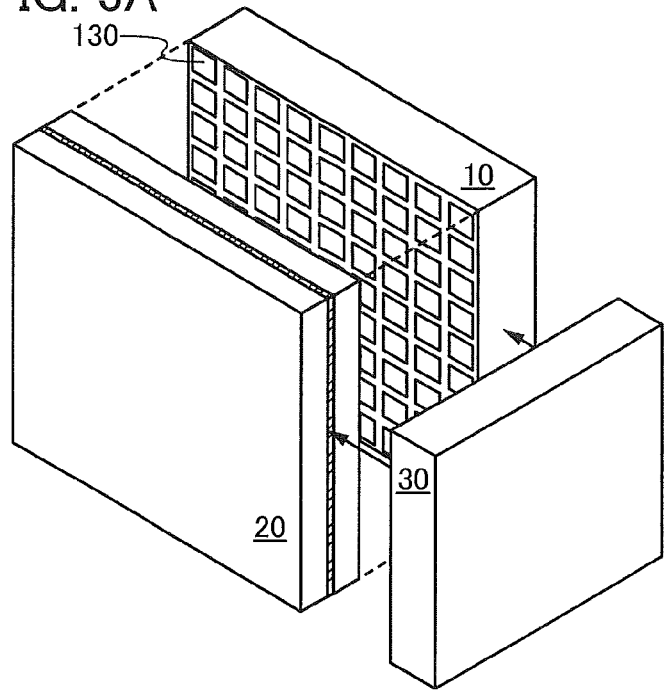
FIGS. 5A to 5D are diagrams showing a display device in accordance with one embodiment of the present invention.

A display device illustrated in FIG. 5A includes a display panel 10 and a shutter panel 20 that is provided on the side where light is emitted from the display panel 10, that is, a side of the display device which is viewed by a user. Note that the display device shown in FIG. 5A includes the display device in accordance with any of the above-described embodiments as the display panel 10.

The shutter panel 20 includes a plurality of optical shutter regions. Each optical shutter region includes a liquid crystal element and a switching element for selecting the transmissive or non-transmissive state of the liquid crystal element. When the liquid crystal element is put in a non-transmissive state, light emitted from the display panel 10 can be blocked.

By selectively providing a light-blocking region (barrier region) to light emitted from the display panel 10, a particular viewing angle is given. Consequently, light is emitted to different space regions for a right-eye and a left-eye, so that a user recognizes only images corresponding to the respective eyes. Thus, the display device can display a 3D image. In other words, in FIG. 5A, the shutter panel 20 serves as a so-called parallax barrier, and by providing the shutter panel 20, a parallax is given to emission from the display panel and thus the display device can display a 3D image. When the light-blocking region is not provided in the shutter panel 20 (when all the liquid crystal elements included in the shutter panel 20 are brought into a transmissive state), a two-dimensional (2D) image can be displayed, and 3D image display and 2D image display can be interchanged by switching of the liquid crystal elements included in the shutter panel 20.

Note that a plurality of optical shutter regions included in the shutter panel 20 can be driven either with active matrix driving in which a switching element is provided for each of optical shutter regions in a dot pattern, or with passive matrix driving in which a switching element is provided for a plurality of optical shutter regions.

For electrodes of the liquid crystal elements, the electrode connected to the switching element may be formed in stripe and the other may be formed in a plate shape to form optical shutter regions in a line pattern. The optical shutter regions can be formed in a dot pattern by using a structure in which a pair of electrodes in stripes are overlapped with each other in a lattice pattern with liquid crystals therebetween, or a structure in which the electrodes connected to the switching elements are formed in a dot pattern. Thus, a light-blocking region or a light-transmitting region can be controlled more accurately.

By driving the optical shutter regions by the active matrix driving and separately driving a plurality of pixels 130 included in the display panel 10 and the optical shutter regions included in the shutter panel 20, both 3D image display and 2D image display can be achieved.

Although not illustrated in this embodiment, the shutter panel 20 is provided with an optical film such as a polarizing plate, a retardation plate, or an anti-reflection film, or the like as appropriate. The shutter panel 20 can employ a variety of transmissive liquid crystal elements and a variety of liquid crystal modes.

The display device in accordance with this embodiment is capable of 3D image display and 2D image display by separately controlling driving of a plurality of pixel 130 included in the display panel 10 and driving of a plurality of optical shutter regions included in the shutter panel 20. Here, drive frequency employed for the display panel 10 and drive frequency employed for the shutter panel 20 are different. In other words, the display panel 10 should be constantly driven in order to display a moving image, and the shutter panel 20 should be regularly or irregularly driven in response to switching between 3D image display and 2D image display. In that case, a period during which the shutter panel 20 needs to be driven is much shorter than a period during which the shutter panel 20 is kept in a certain state.

The display device in FIG. 5A preferably further includes a controller 30 for controlling the operation of the display panel 10 and shutter panel 20. The controller 30 has a function of controlling movie display in the display panel 10 and a function of making the shutter panel 20 operate only in a desired period (hereinafter also referred to as operation period) and retaining the state of the shutter panel 20 in a period other than the operation period (hereinafter also referred to as retention period). Providing the retention period for the operation of the shutter panel 20 can reduce the power consumption of the display device.

Figure 5B:
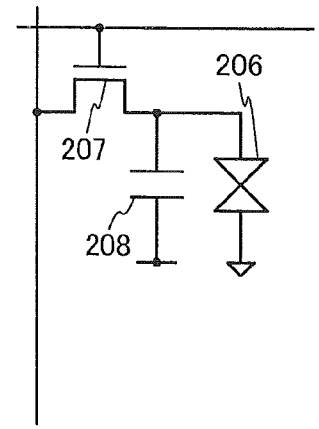

FIG. 5B illustrates an example of an equivalent circuit diagram of the optical shutter region. The optical shutter region can include a transistor 207, a liquid crystal element 206 to which a signal is input through the transistor 207, and a capacitor 208 for holding the potential of the signal. Whether light is transmitted or not is selected by control of the alignment of liquid crystals in the liquid crystal element 206 in response to the potential of the signal. Thus, in order to perform such operation, it is necessary to hold the potential of the signal for a long time. In order to meet the need, a channel region of the transistor 207 is preferably formed using an oxide semiconductor. This is because leakage of electric charge through the transistor 207 can be inhibited, so that a fluctuation in the potential of the signal can be suppressed.

An oxide semiconductor has a wider band gap and lower intrinsic carrier density than silicon. Thus, with the use of an oxide semiconductor for the semiconductor layer of the transistor 207, a transistor that has much smaller amount of off-state current than a transistor containing a normal semiconductor such as silicon or germanium can be formed. As the oxide semiconductor, any material described in Embodiment 2 can be used.

A transistor including a highly-purified oxide semiconductor has extremely small off-state current. Specifically, the concentration of hydrogen in the highly-purified oxide semiconductor that is measured by secondary ion mass spectroscopy (SIMS) is $5\times10^{19}/cm^3$ or lower, preferably $5\times10^{18}/cm^3$ or lower, more preferably $5\times10^{17}/cm^3$ or lower, still more preferably $1\times10^{16}/cm^3$ or lower. In addition, the carrier density of the oxide semiconductor that can be measured by Hall effect measurement is lower than $1\times10^{14}/cm^3$, preferably lower than $1\times10^{12}/cm^3$, more preferably lower than $1\times10^{11}/cm^3$. Further, the band gap of the oxide semiconductor is 2 eV or more, preferably 2.5 eV or more, more preferably 3 eV or more.

Note that various experiments can show that off-state current of a transistor including such a highly-purified oxide semiconductor film as an active layer is small. For example, even in an element with a channel width of $1\times10^6$ μm and a channel length of 10 μm, in a range of 1 to 10 V of voltage (drain voltage) between a source terminal and a drain terminal, off-state current can be lower than or equal to the measurement limit of a semiconductor parameter analyzer, that is, lower than or equal to $1\times10^{-13}$ A. In that case, it can be seen that off-state current density corresponding to a value obtained by division of the off-state current by the channel width of the transistor is lower than or equal to 100 zA/μm (the unit A/μm corresponds to a current value per micrometer of a channel width).

Note that the concentration of hydrogen in a semiconductor film and a conductive film can be measured by secondary ion mass spectroscopy (SIMS). It is known that it is difficult to obtain precise data in the vicinity of a surface of a sample or in the vicinity of an interface between stacked films formed using different materials by a SIMS analysis in principle. Thus, in the case where the distribution of the concentration of hydrogen in a film in a thickness direction is analyzed by SIMS, an average value in a region of the film in which the value is not greatly changed and substantially the same value can be obtained is employed as the hydrogen concentration. In addition, in the case where the thickness of the film is small, a region where substantially the same value can be obtained cannot be found in some cases due to the influence of the hydrogen concentration in an adjacent film. In that case, the maximum value or the minimum value of the hydrogen concentration in the region of the film is employed as the hydrogen concentration of the film. Further, in the case where a mountain-shaped peak having a maximum value or a valley-shaped peak having a minimum value do not exist in the region of the film, the value at an inflection point is employed as the hydrogen concentration.

Figure 5C:
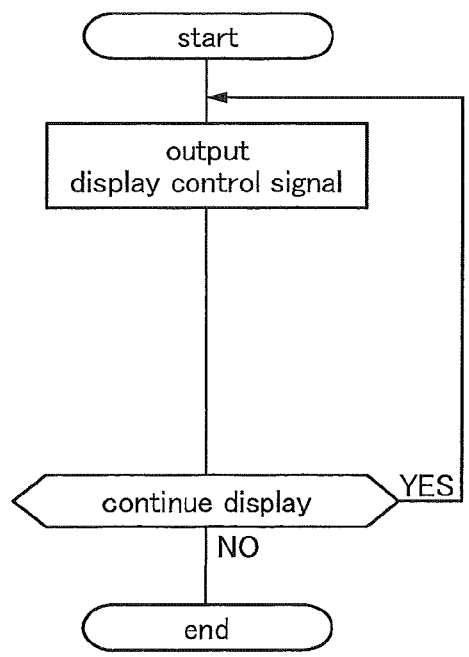
Figure 5D:
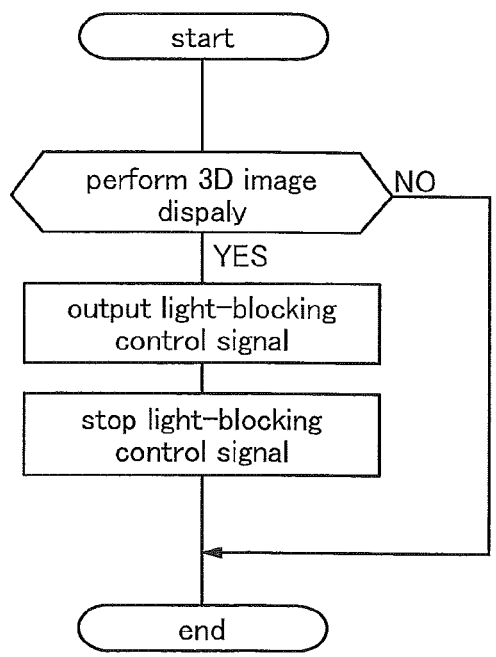

FIGS. 5C and 5D are flow charts each illustrating an operation example of the controller 30 in FIG. 5A. Specifically, FIG. 5C is a flow chart illustrating an operation example of the controller 30 for controlling the display panel 10, and FIG. 5D is a flow chart illustrating an operation example of the controller 30 for controlling the shutter panel 20.

When the controller 30 starts to operate, a display control signal is output to the display panel 10 (see FIG. 5C). Here, the display control signal indicates image signals input to the plurality of pixels 130 arranged in matrix, signals for controlling operation (e.g., clock signals), and the like. The display control signal is constantly supplied to the display panel 10 during display in the display panel 10 is continued by the controller 30.

Further, in the case where the controller 30 operates and the display device performs 3D image display, the controller 30 outputs a light-blocking control signal to the shutter panel 20 (see FIG. 5D). Here, the light-blocking control signal indicates control signals for the transistor 207 (signals for determining light-blocking of the liquid crystal element 206), signals for controlling operation (e.g., clock signals), and the like. After control signals are supplied to the transistor 207, supply of light-blocking control signals is stopped. Note that in the case where a region for 3D image display is changed, the controller 30 outputs a light-blocking control signal to the shutter panel 20 again. In this manner, the light-blocking control signal is regularly or irregularly supplied to the shutter panel 20 when 3D image display is performed.

Note that in the flow chart in FIG. 5D, in the case where the light-blocking control signal is not supplied to the shutter panel 20 for a long time, a light-blocking control signal for performing 3D image display can be supplied to the shutter panel 20 again (refresh). In other words, in the case where 3D image display is performed in the display device for a long time, a light-blocking control signal for performing 3D image display can be supplied to the shutter panel 20 as appropriate (regularly or irregularly).

As described above, the display device includes the display panel 10 and the shutter panel 20 placed on the side where light is emitted from the display pane; 10, and thus achieves 3D image display. Moreover, the display device can display 3D images with high color reproducibility at low power consumption when the display device described in any of the above-described embodiments is used as a display panel. Further, a high definition 3D display can be performed.

The operation in this embodiment eliminates the need for constantly driving the shutter panel 20, so that the power consumption of the display device can be more reduced.

The methods, structures, and the like described in this embodiment can be combined as appropriate with any of the methods and structures described in the other embodiments.

Embodiment 4

The display device in accordance with one embodiment of the present invention can be used for computers such as laptops, or image reproducing devices provided with recording media (typically, devices which reproduce the content of recording media such as digital versatile discs (DVDs) and have displays for displaying the reproduced images). Other examples of electronic devices that can use the display device in accordance with one embodiment of the present invention include cellular phones, portable game machines, personal digital assistants, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. In this example, specific examples of these electronic devices are described with reference to FIGS. 6A to 6C.

Figure 6A:
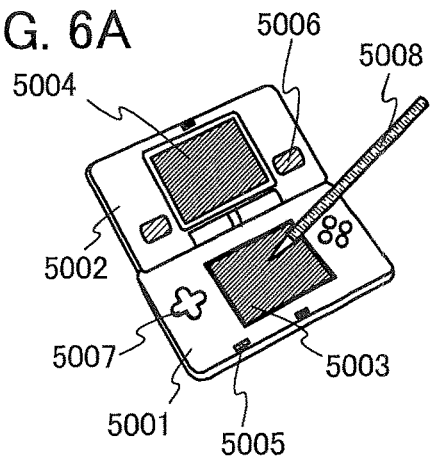
FIGS. 6A to 6C each illustrate an example of a usage mode of a display device.

FIG. 6A illustrates a portable game machine, which includes a housing 5001, a housing 5002, a display portion 5003, a display portion 5004, a microphone 5005, speakers 5006, an operation key 5007, a stylus 5008, and the like. The display device described in any of the above-described embodiments can be used in the display portion 5003 or the display portion 5004. It is possible to provide a portable game machine with high color reproducibility and low power consumption when the display device described in any of the above-described embodiments is used as the display portion 5003 or 5004. Note that although the portable game machine in FIG. 5A has the two display portions 5003 and 5004, the number of display portions included in the portable game machine is not limited to two.

Figure 6B:
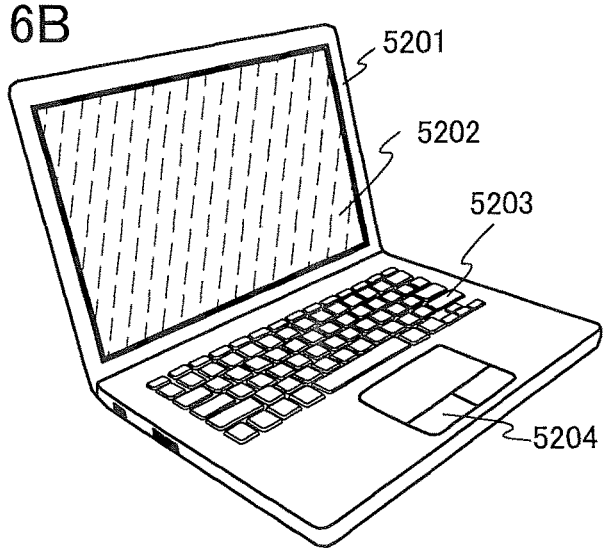

FIG. 6B illustrates a laptop computer, which includes a housing 5201, a display portion 5202, a keyboard 5203, a pointing device 5204, and the like. The display device described in any of the above-described embodiments can be used in the display portion 5202. It is possible to provide a laptop computer with high color reproducibility and low power consumption when the display device described in any of the above-described embodiments is used as the display portion 5202.

Figure 6C:
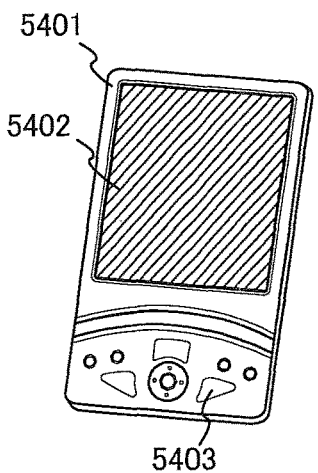

FIG. 6C illustrates a personal digital assistant, which includes a housing 5401, a display portion 5402, operation keys 5403, and the like. The display device described in any of the above-described embodiments can be used in the display portion 5402. It is possible to provide a personal digital assistant with high color reproducibility and low power consumption when the display device described in any of the above-described embodiments is used as the display portion 5402.

The methods, structure, and the like described in this embodiment can be combined as appropriate with any of the methods and structures described in the other embodiments.

Example 1

In this example, measurement results of characteristics of a display device in accordance with one embodiment of the present invention will be described with reference to drawings and tables.

Figure 7:
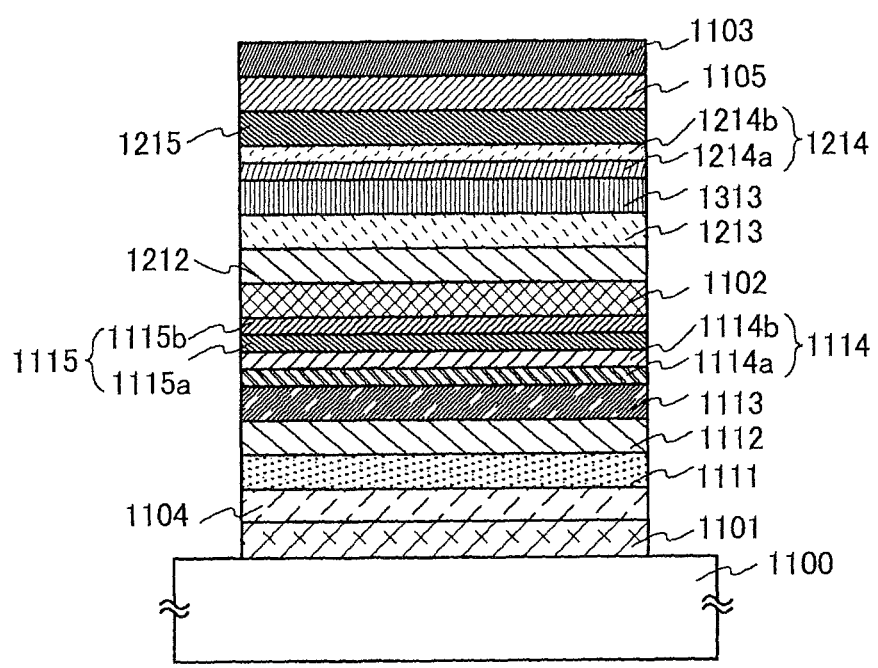
FIG. 7 illustrates an element structure of Example 1.

Fabrication methods of the light-emitting element R, the light-emitting element and the light-emitting element B are described with reference to FIG. 7. Shown below are structural formulae of organic compounds used in this example (BPhen, 9-phenyl-3-[4-(10-phenyl-9-anthryl)phenyl]-9H-carbazole (abbreviation: PCzPA), 9-[4-(N-carbazolyl)]phenyl-10-phenylanthracene (abbreviation: CzPA), 4-phenyl-4'-(9-phenylfluoren-9-yl)triphenylamine (abbreviation: BPAFLP), N,N'-bis(3-methylphenyl)-N,N'-bis[3-(9-phenyl-9H-fluoren-9-yl)phenyl]-pyrene-1,6-dia mine (abbreviation: 1,6mMemFLPAPrn), 2-[3-(dibenzothiophen-4-yl)phenyl] dibenzo[f,h]quinoxaline (abbreviation: 2mDBTPDBq-II), 4-phenyl-4'-(9-phenyl-9H-carbazol-3-yl)triphenylamine (abbreviation: PCBA1BP), (acetylacetonato)bis(6-methyl-4-phenylpyrimidinato)iridium(III) (abbreviation: Ir(mppm)$_2$(acac)), and bis(2,3,5-triphenylpyrazinato)(dipivaloylmethanato)iridium(III) (abbreviation: Ir(tppr)$_2$(dpm))).

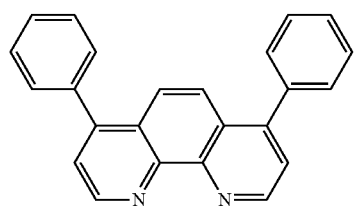
BPhen
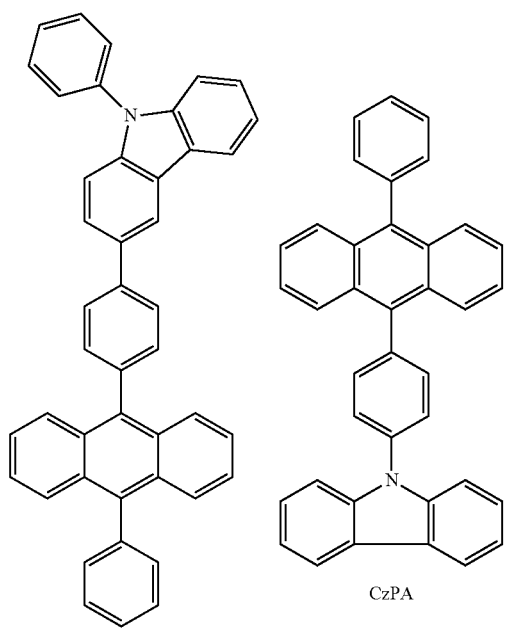
PCzPA
CzPA
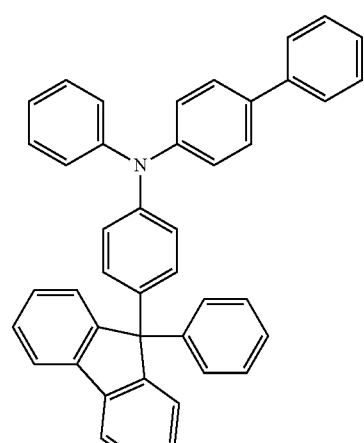
BPAFLP
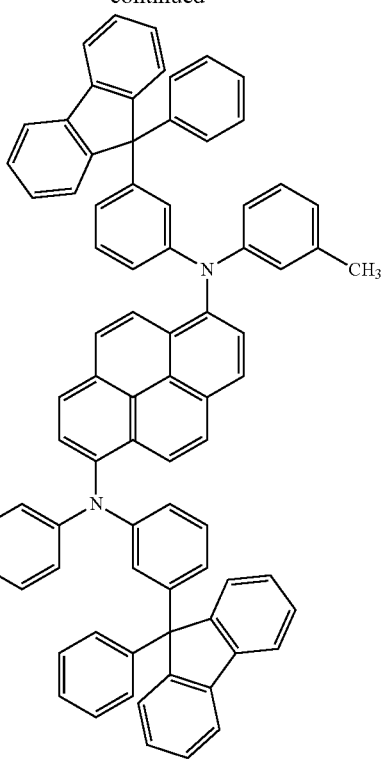
1,6mMemFLPAPm
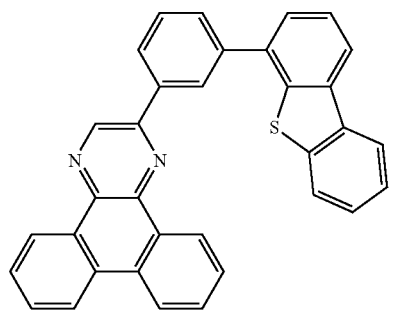
2mDBTPDBq-II
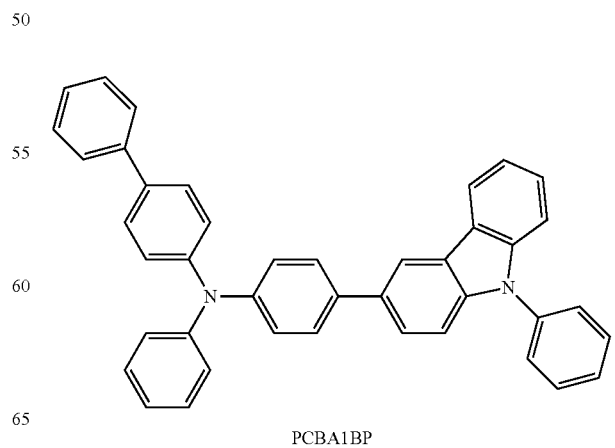
PCBA1BP

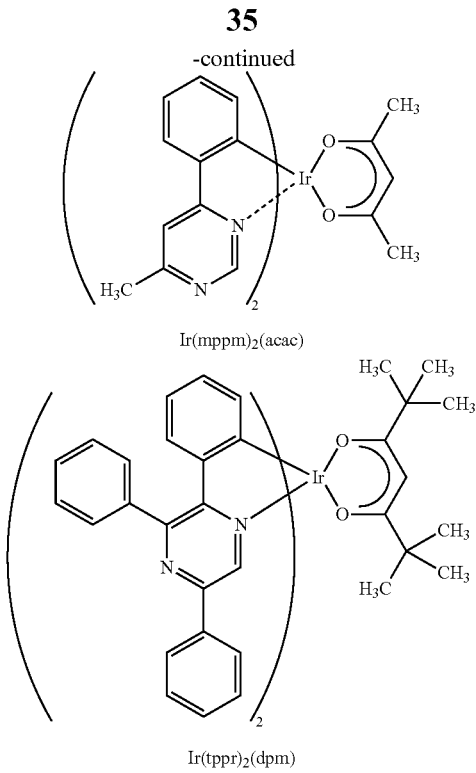

Ir(mppm)₂(acac)

Ir(tppr)₂(dpm)

In each of the light-emitting element R, the light-emitting element G, and the light-emitting element B, an aluminum-titanium alloy film and a titanium film were formed sequentially by a sputtering method, to form a first electrode 1101 over a substrate 1100 of glass. The film-thickness and the area of the first electrode 1101 were 6 nm and 2 mm×2 mm, respectively. In this example, the first electrode 1101 was used as an anode.

Next, indium tin oxide containing silicon oxide was deposited over the first electrode 1101 by a sputtering method to form a first conductive layer 1104 in each of the light-emitting element R and the light-emitting element G. To obtain a microcavity effect in the light-emitting element R, the light-emitting element G, and the light-emitting element B, the film-thickness of the first conductive layer 1104 in the light-emitting element R was 90 nm, the film-thickness of the first conductive layer 1104 in the light-emitting element G was 40 nm, and the first conductive layer 1104 was not provided in the light-emitting element B.

Next, the substrate 1100 provided with the first electrode 1101 and the first conductive layer 1104 was fixed to a substrate holder in the vacuum evaporation apparatus so that a surface over which the first electrode 1101 and the first conductive layer 1104 were provided faced downward. The pressure in the vacuum evaporation apparatus was reduced to about $10^{-4}$ Pa. Then, over the first electrode 1101 or the first conductive layer 1104, PCzPA and molybdenum (VI) oxide were co-evaporated to form a hole-injection layer 1111. The weight ratio of PCzPA to molybdenum oxide was adjusted to 1:0.5 (=PCzPA:molybdenum oxide), and the film-thickness of the hole-injection layer 1111 was 20 nm. Note that the co-evaporation method refers to an evaporation method in which evaporation is carried out from a plurality of evaporation sources at the same time in one treatment chamber.

Next, over the hole-injection layer 1111, a 20-nm-thick PCzPA film was formed to form a hole-transport layer 1112.

Over the hole-transport layer 1112, CzPA and 1,6mMem-FLPAPrn were co-evaporated so that the weight ratio of CzPA to 1,6mMemFLPAPrn was 1:0.05 to form a light-emitting layer 1113. The film-thickness of the light-emitting layer 1113 was 30 nm.

Over the light-emitting layer 1113, CzPA was deposited to a thickness of 5 nm to form an electron-transport layer 1114a.

Then, over the electron-transport layer 1114a, a film of bathophenanthroline (abbreviation: BPhen) was formed to a thickness of 15 nm to form an electron-transport layer 1114b.

A 1-nm-thick film of calcium (Ca) was deposited over the electron-transport layer 1114b by evaporation to form an electron-injection layer 1115a, and a 2-nm-thick film of copper(II) phthalocyanine (abbreviation: CuPc) was deposited over the electron-injection layer 1115a by evaporation to form an electron-injection layer 1115b.

Over the electron-injection layer 1115b, PCzPA and molybdenum (VI) oxide were co-evaporated to form a charge-generation layer 1102. The weight ratio of PCzPA to molybdenum oxide was adjusted to be 1:0.5 (=PCzPA:molybdenum oxide). The thickness of the charge-generation layer 1102 was 30 nm.

Over the charge-generation layer 1102, BPAFLP was deposited to a thickness of 20 nm to form a hole-transport layer 1212.

Over the hole-transport layer 1212, 2mDBTPDBq-II, PCBA1BP, and Ir(mppm)₂(acac) were co-evaporated so that the weight ratio of 2mDBTPDBq-II to PCBA1BP and Ir(mppm)₂(acac) was 0.8:0.2:0.6 to form a light-emitting layer 1213. The thickness of the light-emitting layer 1213 was 20 nm.

Over the light-emitting layer 1213, 2mDBTPDBq-II and Ir(tppr)₂(dpm) were co-evaporated so that the weight ratio of 2mDBTPDBq-II to Ir(tppr)₂(dpm) was 1:0.02 to form a light-emitting layer 1313. The thickness of the light-emitting layer 1313 was 20 nm.

Over the light-emitting layer 1313, 2mDBTPDBq-II was deposited to a thickness of 15 nm to form an electron-transport layer 1214a.

Over the electron-transport layer 1214a, BPhen was deposited to a thickness of 15 nm to form an electron-transport layer 1214b.

Further, a lithium fluoride (LiF) film was formed to a thickness of 1 nm over the electron-transport layer 1214b by evaporation, whereby an electron-injection layer 1215 was formed.

Over the electron-injection layer 1215, silver and magnesium were deposited to a thickness of 10 nm so that the volume ratio of silver to magnesium was 10:1 to form a film containing silver and magnesium (AgMg film) as a second conductive layer 1105.

Over the second conductive layer 1105, indium tin oxide was deposited to a thickness of 50 nm by a sputtering method to form a second electrode 1103.

Through the above steps, the light-emitting element R, the light-emitting element G, and the light-emitting element B which were used in this example were fabricated.

Note that, in the above evaporation process, evaporation was all performed by a resistance heating method.

Table 1 shows the element structures of the light-emitting element R, the light-emitting element G, and the light-emitting element B which were fabricated in the above manner.

TABLE 1

| | first electrode 1101 | first conductive layer 1104 | hole-injection layer 1111 | hole-transport layer 1112 |
|---|---|---|---|---|
| Light-emitting element R | Al—Ti\Ti 6 nm | ITSO 90 nm | PCzPA:MoOx (=1:0.5) 20 nm | PczPA 20 nm |
| Light-emitting element G | Al—Ti\Ti 6 nm | ITSO 40 nm | PCzPA:MoOx (=1:0.5) 20 nm | PczPA 20 nm |
| Light-emitting element B | Al—Ti\Ti 6 nm | ITSO 0 nm | PCzPA:MoOx (=1:0.5) 20 nm | PczPA 20 nm |

| light-emitting layer 1113 | electron-transport layer 1114a | 1114b | electron-injection layer 1115a | 1115b | charge-generation layer 1102 |
|---|---|---|---|---|---|
| CzPA:1,6-mMemFLPAPrn (=1:0.05) 30 nm | CzPA 5 nm | BPhen 15 nm | Ca 1 nm | CuPc 2 nm | PCzPA:MoOx (=1:0.5) 30 nm |
| CzPA:1,6-mMemFLPAPrn (=1:0.05) 30 nm | CzPA 5 nm | BPhen 15 nm | Ca 1 nm | CuPc 2 nm | PCzPA:MoOx (=1:0.5) 30 nm |
| CzPA:1,6-mMemFLPAPrn (=1:0.05) 30 nm | CzPA 5 nm | BPhen 15 nm | Ca 1 nm | CuPc 2 nm | PCzPA:MoOx (=1:0.5) 30 nm |

| hole-transport layer 1212 | light-emitting layer 1213 | light-emitting layer 1313 | electron-transport layer 1214a | 1214b |
|---|---|---|---|---|
| BPAFLP 20 nm | 2mDBTPDBq II:PCBA1BP:Ir(mppm)₂acac (=0.8:0.2:0.06) 20 nm | 2mDBTPDBq II:Ir(tppr)₂dpm (=1:0.02) 20 nm | 2mDBTPDBq II 15 nm | Bphen 15 nm |
| BPAFLP 20 nm | 2mDBTPDBq II:PCBA1BP:Ir(mppm)₂acac (=0.8:0.2:0.06) 20 nm | 2mDBTPDBq II:Ir(tppr)₂dpm (=1:0.02) 20 nm | 2mDBTPDBq II 15 nm | Bphen 15 nm |
| BPAFLP 20 nm | 2mDBTPDBq II:PCBA1BP:Ir(mppm)₂acac (=0.8:0.2:0.06) 20 nm | 2mDBTPDBq II:Ir(tppr)₂dpm (=1:0.02) 20 nm | 2mDBTPDBq II 15 nm | BPhen 15 nm |

| electron-injection layer 1215 | second conductive layer 1105 | second electrode 1103 |
|---|---|---|
| LiF 1 nm | Ag:Mg (=10:1) 10 nm | ITO 50 nm |
| LiF 1 nm | Ag:Mg (=10:1) 10 nm | ITO 50 nm |
| LiF 1 nm | Ag:Mg (=10:1) 10 nm | ITO 50 nm |

*The mixture ratios are all represented in weight ratios.

The light-emitting element R, the light-emitting element G, and the light-emitting element B were sealed with a glass substrate in a glove box under a nitrogen atmosphere so as not to be exposed to the air. Then, operation characteristics of these light-emitting elements were measured. Note that the measurement was carried out at room temperature (in an atmosphere kept at 25° C.).

Figure 9:
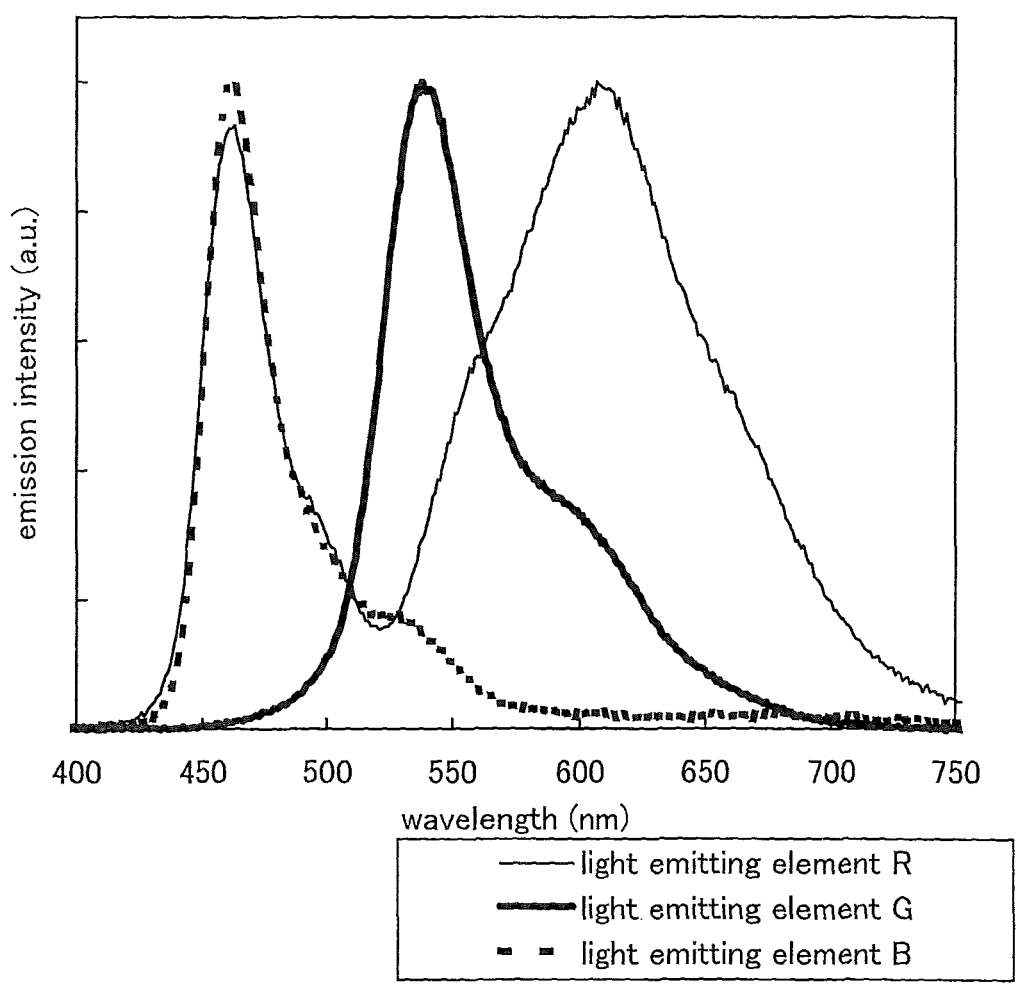
FIG. 9 is a graph showing characteristics of the display device of Example 1.

FIG. 9 shows emission spectra of the light-emitting elements. In FIG. 9, the spectra of the light-emitting element R, the light-emitting element G, and the light-emitting element B are shown by a thin solid line, a thick solid line, and a thick dotted line, respectively, and the horizontal axis represents wavelength (nm) and the vertical axis represents emission intensity (arbitrary unit).

In each of the light-emitting element R, the light-emitting element G, and the light-emitting element B, the optical path length between the first electrode 1101 serving as a reflective electrode and the second electrode 1103 serving as a light-transmitting electrode is adjusted to obtain a microcavity effect, and thus each desired spectrum is amplified so that the color purity can be high.

As illustrated in FIG. 9, in the light-emitting element R, favorable red light emitted from the light-emitting layer 1313, which has a peak around 607 nm, is observed. In the light-emitting element G, favorable green light emitted from the light-emitting layer 1213, which has a peak around 538 nm, is observed. In the light-emitting element B, favorable blue light emitted from the light-emitting layer 1113, which has a peak around 463 nm, is observed.

Next, the light-emitting element R, the light-emitting element G, and the light-emitting element B were used to form a pixel R, a pixel G, and a pixel B, and a color filter layer CF(R), a color filter layer CF(G), and a color filter layer CF(B) were used to be overlapped with the light-emitting element R, the light-emitting element G, and the light-emitting element B, respectively to form a pixel RCF, a pixel GCF, and a pixel BCF.

The color filter layer CF(R), the color filter layer CF(G), and the color filter layer CF(B) were each formed in such a manner that CR-7001W (manufactured by FUJIFILM Corporation), CG-7001W (manufactured by FUJIFILM Corporation), and CB-7001W (manufactured by FUJIFILM Corporation) which were each used as a material was applied onto a glass substrate, and then baked at 220° C. for an hour. The thickness was 1.3 µm to 1.4 µm. Note that the material for color filter layers was applied onto the glass substrate by a spin coating method at a spinning rate of 500 rpm for the color filter layer CF(R), 500 rpm for the color filter layer CF(G), and at a spinning rate of 1000 rpm for the color filter layer CF (B).

Figure 10:
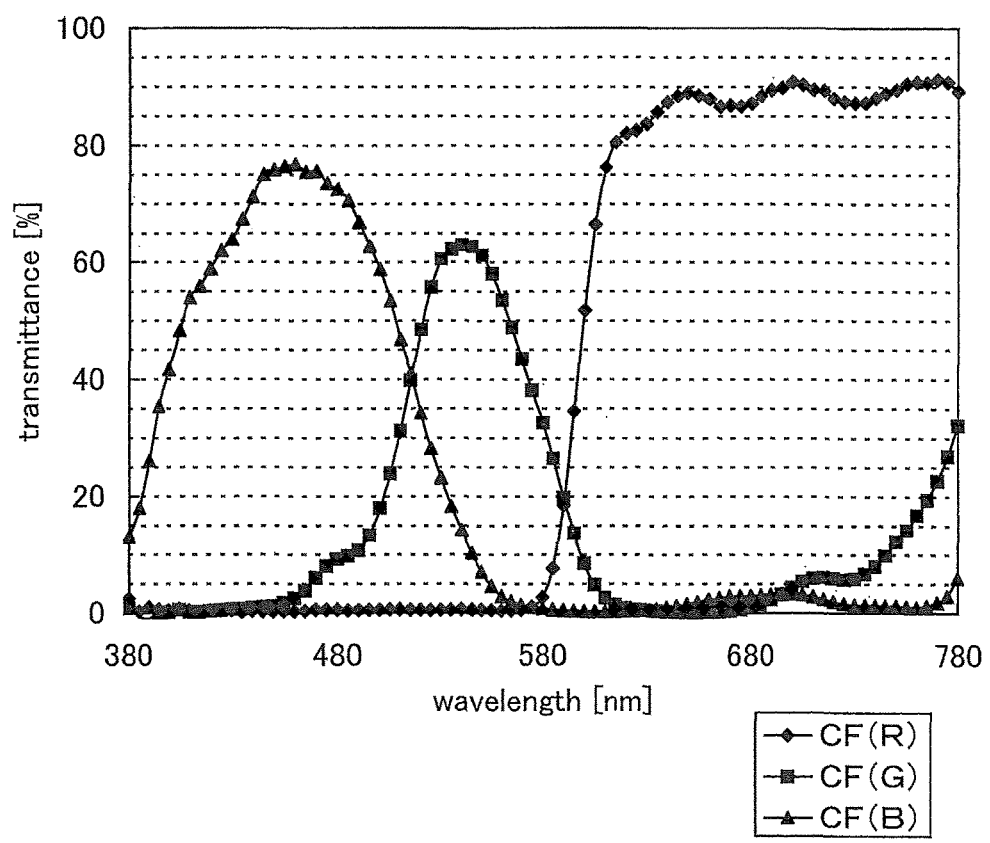
FIG. 10 is a graph showing transmittances of color filter layers.

FIG. 10 shows the relation between wavelengths and transmittances of the color filter layer CF(R), the color filter layer CF(G), and the color filter layer CF(B). In FIG. 10, the rhombuses represent the color filter layer CF(R), the squares represent the color filter layer CF(G) and the triangles represent the color filter layer CF (B). The transmittance was measured with U-4000 Spectrophotometer (manufactured by Hitachi High-Technologies Corporation.) by setting light that is emitted from a light source and passes through the glass substrate to 100%.

The current efficiency, the CIE chromaticity coordinates (x, y), and the voltage of each of the pixel R, the pixel G, the pixel B, the pixel RCF, the pixel GCF, and the pixel BCF were measured under the condition in which a luminance of about 1000 cd/m$^2$ was able to be obtained.

As for the pixel R, the current efficiency was 27 cd/A, the CIE chromaticity coordinates were (x, y)=(0.40, 0.31), and the voltage was 6.4 V. As for the pixel G, the current efficiency was 55 cd/A, the CIE chromaticity coordinates were (x, y) 0.60), and the voltage was 6.0 V. As for the pixel B, the current efficiency was 8.2 cd/A, the CIE chromaticity coordinates were (x, y)=(0.16, 0.16), and the voltage was 7.6 V.

As for the pixel RCF, the current efficiency was 6.0 cd/A, the CIE chromaticity coordinates were (x, y)=(0.67, 0.32), and the voltage was 7.0 V. As for the pixel GCF, the current efficiency was 33 cd/A, the CIE chromaticity coordinates were (x, y) 0.67), and the voltage was 6.2 V. As for the pixel BCF, the current efficiency was 3.4 cd/A, the CIE chromaticity coordinates were (x, y)=(0.14, 0.10), and the voltage was 8.4 V.

Figure 8:
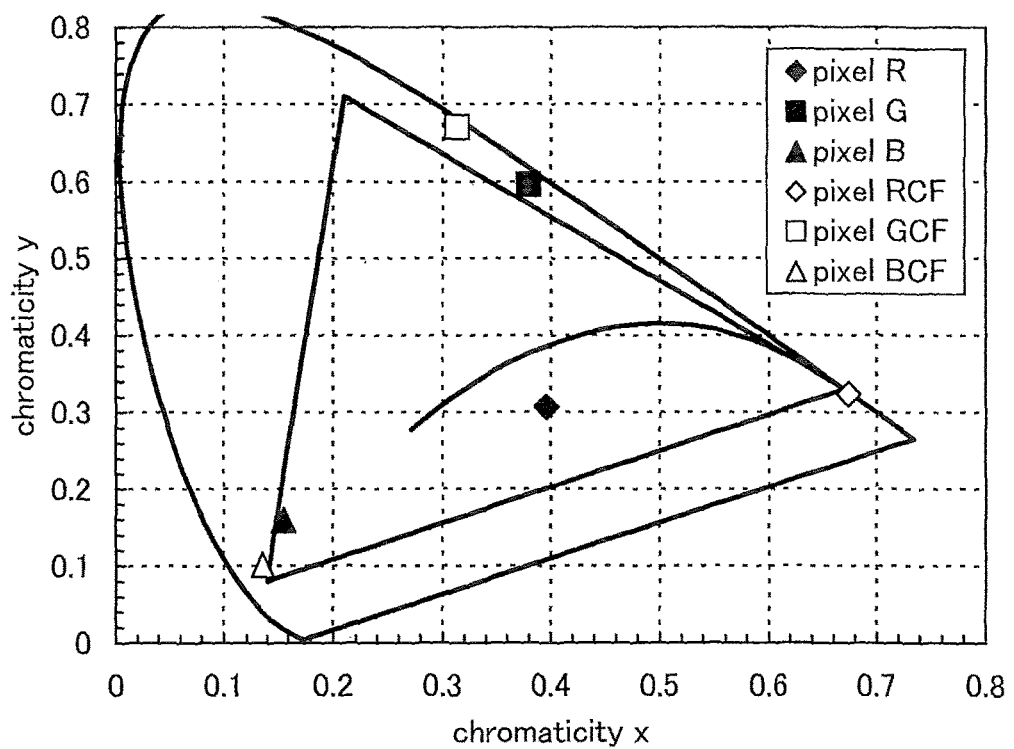
FIG. 8 is a graph showing characteristics of the display device of Example 1.

The chromaticities of the pixel R, the pixel G, the pixel B, the pixel RCF, the pixel GCF, and the pixel BCF are shown in the chromaticity coordinates in FIG. 8. In FIG. 8, the black rhombus corresponds to the pixel R, the black square corresponds to the pixel G, the black triangle corresponds to the pixel B, the white rhombus corresponds to the pixel RCF, the white square corresponds to the pixel GCF, the white triangle corresponds to the pixel BCF and the solid line represents the NTSC ratio defined by NTSC.

As shown in FIG. 8, the pixel B, the pixel BCF, the pixel G, and the pixel GCF have less deviation from the NTSC ratio than the pixel R and the pixel RCF, and thus are the pixel B and the pixel G, which are not provided with color filter layers, have high color purity.

Next, with combination of the pixel R, the pixel G, the pixel B, the pixel RCF, the pixel GCF, and/or the pixel BCF, a reference display device 1, a reference display device 2, a display device 1, and a display device 2 were manufactured, and NTSC ratios and power consumption for white emission were calculated. The pixel structures, NTSC ratios, and power consumption of the reference display device 1, the reference display device 2, the display device 1, and the display device 2 are shown in Table 2.

TABLE 2

|  | Pixels | | | | Power |
| --- | --- | --- | --- | --- | --- |
|  | Red pixel | Green pixel | Blue pixel | NTSC ratio (%) | consumption (a.u.) |
| Reference display device 1 | RCF | GCF | BCF | 84 | 1.00 |
| Display device 1 | RCF | GCF | B | 76 | 0.80 |
| Display device 2 | RCF | G | B | 60 | 0.66 |
| Reference display device 2 | R | G | B | 23 | 0.40 |

The reference display device 1 includes the pixel RCF in the pixel for red, the pixel GCF in the pixel for green, and the pixel BCF in the pixel for blue, that is, all pixels have color filter layers, which results in high power consumption. In addition, the reference display device 2 includes the pixel R in the pixel for red, the pixel G in the pixel for green, and the pixel B in the pixel for blue, that is, no color filter layers are provided in all pixels, which result in low NTSC ratios.

On the contrary, the display device 1 in accordance with one embodiment of the present invention includes the pixel RCF in the pixel for red, the pixel GCF in the pixel for green, and the pixel B in the pixel for blue. That is, a color filter layer is provided only for each of the pixels for red and green, and thereby the color purity is increased and the NTSC ratio is 76%, and no color filter layer is provided in the pixel for blue, and thereby power consumption is decreased to 0.80 of that of the reference display device 1. Similarly, the display device 2 in accordance with another embodiment of the present invention includes the pixel RCF in the pixel for red, the pixel G in the pixel for green, and the pixel B in the pixel for blue. That is, a color filter layer is provided only for the pixel for red, and thereby the color purity is increased and the NTSC ratio is 60%, and no color filter layers are provided in the pixels for blue and green, and thereby power consumption is decreased to 0.66 of that of the reference display device 1.

Figure 11:
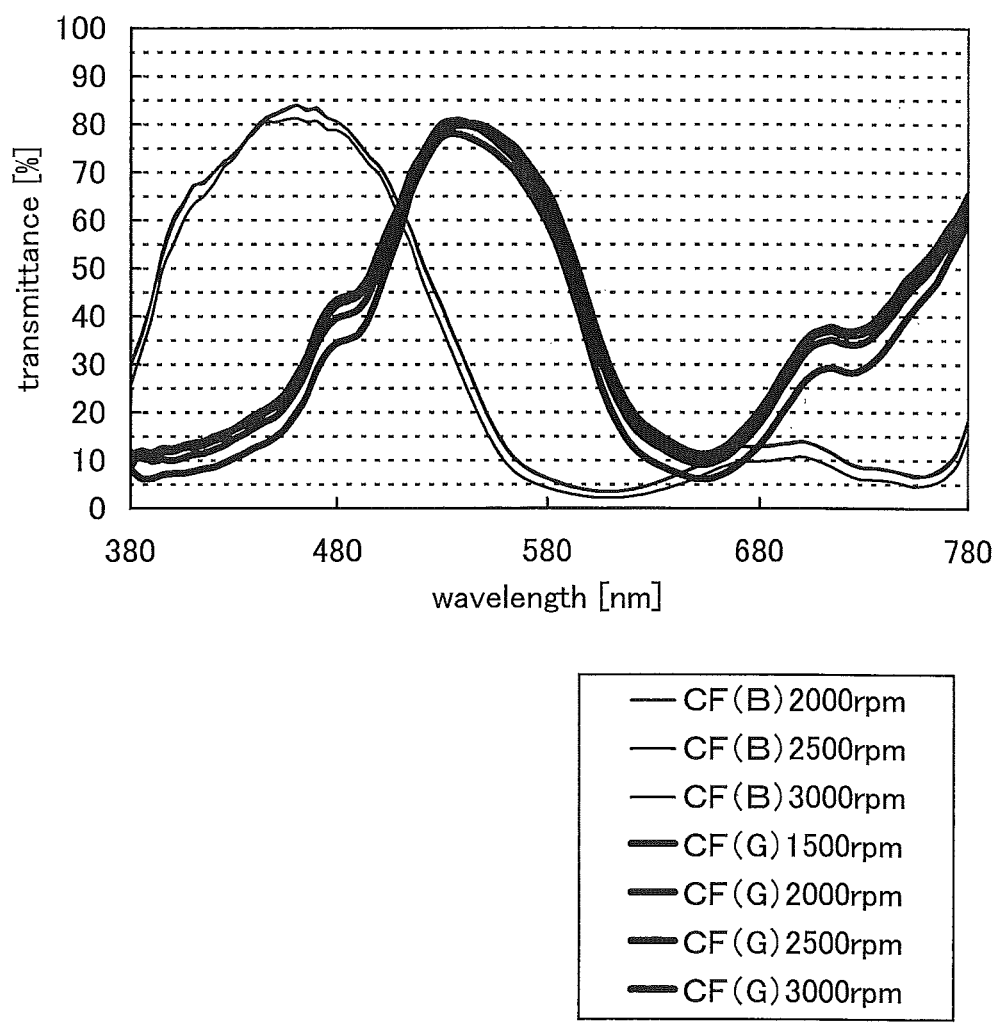
FIG. 11 is a graph showing transmittances of color filter layers.

In addition, FIG. 11 shows the relation between wavelengths and transmittances of the color filter layer CF(G) and color filter layer CF(B) with high transmittance. In FIG. 11, the thick line represents the color filter layer CF(G), and the thin line represents the color filter layer CF(B). The transmittance was measured with U-4000 Spectrophotometer (manufactured by Hitachi High-Technologies Corporation.) by setting light that is emitted from a light source and passes through the glass substrate to 100%.

The color filter layer CF(G) and the color filter layer CF(B) in FIG. 11 are color filter layers which are formed with the same material as those of the color filter layer CF(G) and the color filter layer CF(B) described above, and at a spinning rate of 1500 rpm or more for the color filter layer CF(G) and at a spinning rate of 2000 rpm or more for the color filter layer CF(B) to be thinned for higher transmittance.

As shown in FIG. 11, the color filter layer CF(B) having a maximum transmittance of 80% or more in the blue wavelength region has a maximum transmittance of 5% or more in the wavelength region of 570 nm to 760 nm. In addition, the color filter layer CF(G) having a maximum transmittance of 75% or more in the green wavelength region has a maximum transmittance of 10% or more in the wavelength region of 380 nm to 450 nm.

The light-emitting element B used in the display device in this example has almost no spectra in the wavelength region of 570 nm or more as shown in FIG. 9. Therefore, the color filter layer CF(B) can be used without any difficulty, even when the color filter layer CF(B) is thinned to obtain a maximum transmittance of 80% or more in the blue wavelength region and has a transmittance of 5% or more in the wavelength region of 570 nm to 760 nm.

Similarly, the light-emitting element G used in the display device in this example has almost no spectra in the wavelength region of 450 nm or less as shown in FIG. 9. Therefore, the color filter layer CF(G) can be used without any difficulty, even when the color filter layer CF(G) is thinned to obtain a maximum transmittance of 75% or more in the green wavelength region and has a transmittance of 10% or more in the wavelength region of 380 nm to 450 nm.

As described above, it can be known that, as in the display device 1 and the display device 2 in accordance with embodiments of the present invention, a color filter layer is provided in at least only the pixel for red and no color filter layers or color filter layers with high transmittance are provided in the pixel for blue and the pixel for green, and thereby a display device with high color purity and low power consumption can be provided.

Example 2

In this example, an active matrix display device in accordance with one embodiment of the present invention was manufactured and characteristics thereof were measured. In this example, a display device in which no color filter layers are not provided in some pixels in accordance with one embodiment of the present invention (this device referred to as example panel) and a display device in which color filter layers are provided in all pixels (this device referred to as reference panel) were manufactured and characteristics thereof were compared. The measurement results are described below with reference to drawings and tables.

Structures of the example panel and the reference panel manufactured in this example will now be described.

In the example panel, over a silicon substrate provided with a transistor such as a switching transistor or a driving transistor, pixels for R, G, and B with a display area with 3.93 inches in diagonal (79.92 mm×59.94 mm) were formed with a pixel density of 457.6 ppi with 1440×1080 pixels.

The pixels used in the example panel are pixels having structures similar to the pixels described in Example 1. Specifically, pixels having structures similar to the pixel RCF, the pixel GCF, and the pixel B in Example 1 were used as the pixel for red (R), the pixel for green (G), and the pixel for blue (B), respectively.

In addition, the reference panel was also manufactured so as to have the same size and pixel density as the example panel.

To the pixels used in the reference panel, light-emitting elements having different structures from those of the pixels in Example 1 were applied. The structures of the light-emitting elements used in the reference panel are described next.

The reference light-emitting elements used in the reference panel each have an electron-transport layer 1114 and an electron-injection layer 1115 which are different from the electron-transport layer 1114 and the electron-injection layer 1115 of the light-emitting element in Example 1, but have the other layers similar to those of the light-emitting element in Example 1. For that reason, the structures of only the electron-transport layer and the electron-injection layer are described in detail.

As the electron-transport layer 1114 of each reference light-emitting element, a 15-nm-thick CzPA film was formed. As the electron-injection layer 1115 of each reference light-emitting element, a stacked layer of an electron-injection layer 1115a formed by co-evaporation of BPhen and Ca (weight ratio of BPhen to Ca=1:0.04) and an electron-injection layer 1115b formed of a 2-nm-thick CuPc film was formed.

Table 3 shows the element structures of the reference light-emitting elements.

TABLE 3

|  | First electrode 1101 | First conductive layer 1104 | Hole-injection layer 1111 | Hole-transport layer 1112 | Light-emitting layer 1113 |
|---|---|---|---|---|---|
| Reference light-emitting element R | Al—Ti\Ti 6 nm | ITSO 90 nm | PCzPA:MoOx (=1:0.5) 20 nm | PCzPA 20 nm | CzPA:1,6-mMemFLPAPrn (=1:0.05) 30 nm |
| Reference light-emitting element G | Al—Ti\Ti 6 nm | ITSO 40 nm | PCzPA:MoOx (=1:0.5) 20 nm | PCzPA 20 nm | CzPA:1,6-mMemFLPAPrn (=1:0.05) 30 nm |
| Reference light-emitting element B | Al—Ti\Ti 6 nm | ITSO 0 nm | PCzPA:MoOx (=1:0.5) 20 nm | PCzPA 20 nm | CzPA:1,6-mMemFLPAPrn (=1:0.05) 30 nm |

| Electron-transport layer 1114 | Electron-injection layer | | Charge-generation layer 1102 | Hole-transport layer 1212 |
|---|---|---|---|---|
| | 1115a | 1115b | | |
| CzPA 15 nm | Bphen:Ca (=1:0.04) 5 nm | CuPc 2 nm | PCzPA:MoOx (=1:0.5) 30 nm | BPAFLP 20 nm |
| CzPA 15 nm | Bphen:Ca (=1:0.04) | CuPc 2 nm | PCzPA:MoOx (=1:0.5) | BPAFLP 20 nm |

TABLE 3-continued

| CzPA<br>15 nm | 5 nm<br>Bphen:Ca<br>(=1:0.04)<br>5 nm | CuPc<br>2 nm | 30 nm<br>PCzPA:MoOx<br>(=1:0.5)<br>30 nm | BPAFLP<br>20 nm |
|---|---|---|---|---|
| Light-emitting<br>layer 1213 | Light-emitting<br>layer 1313 | Electron-transport layer | | Electron-injection<br>layer 1215 |
| | | 1214a | 1214b | |
| 2mDBTPDBq<br>II:PCBA1BP:Ir(mppm)$_2$acac<br>(=0.8:0.2:0.06)<br>20 nm | 2mDBTPDBq<br>II:Ir(tppr)$_2$dpm<br>(=1:0.02)<br>20 nm | 2mDBTPDBq<br>II<br>15 nm | Bphen<br>15 nm | LiF<br>1 nm |
| 2mDBTPDBq<br>II:PCBA1BP:Ir(mppm)$_2$acac<br>(=0.8:0.2:0.06)<br>20 nm | 2mDBTPDBq<br>II:Ir(tppr)$_2$dpm<br>(=1:0.02)<br>20 nm | 2mDBTPDBq<br>II<br>15 nm | Bphen<br>15 nm | LiF<br>1 nm |
| 2mDBTPDBq<br>II:PCBA1BP:Ir(mppm)$_2$acac<br>(=0.8:0.2:0.06)<br>20 nm | 2mDBTPDBq<br>II:Ir(tppr)$_2$dpm<br>(=1:0.02)<br>20 nm | 2mDBTPDBq<br>II<br>15 nm | BPhen<br>15 nm | LiF<br>1 nm |

| Second conductive<br>layer 1105 | Second<br>electrode 1103 |
|---|---|
| Ag:Mg<br>(=10:1)<br>10 nm | ITO<br>50 nm |
| Ag:Mg<br>(=10:1)<br>10 nm | ITO<br>50 nm |
| Ag:Mg<br>(=10:1)<br>10 nm | ITO<br>50 nm |

*The mixture ratios are all represented in weight ratios.

The reference panel was formed with use of the reference pixel RCF, the reference pixel GCF, and the reference pixel BCF in which color filter layers were provided for the reference light-emitting element R, the reference light-emitting element G, and the reference light-emitting element B having the above structures. Note that as the color filter layers, ones similar to the color filter layers in Example 1 were used.

Characteristics of the example panel and the reference panel manufactured in the above manner were measured. Note that the light-emitting elements used in the reference panel are different from those used in the example panel, in the structures of the electron-transport layers and the electron-injection layers; however, difference in emission characteristics and electric characteristics due to that is small and thus the reference panel can be referred to, as a comparative example, without any difficulties.

Figure 12A:
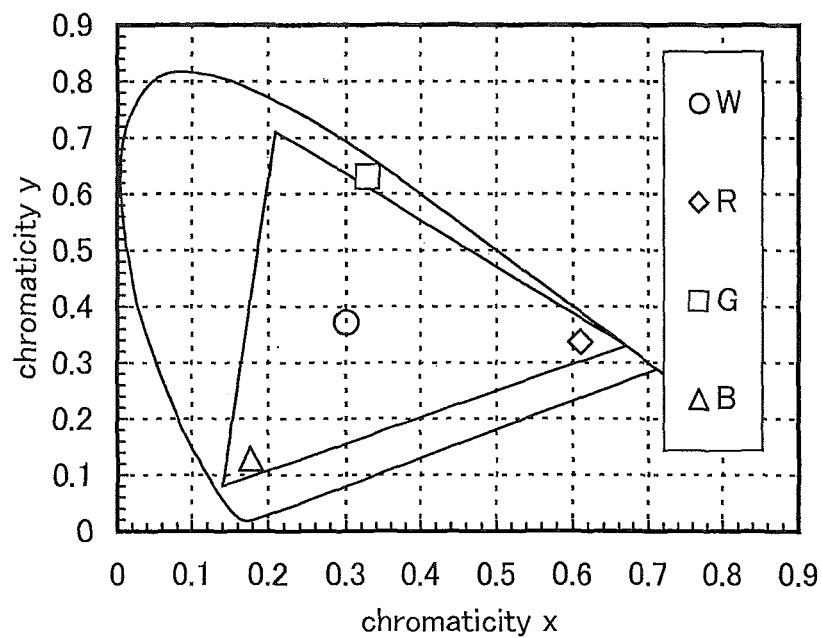
FIGS. 12A and 12B are graphs each showing characteristics of a display device of Example 2.
Figure 12B:
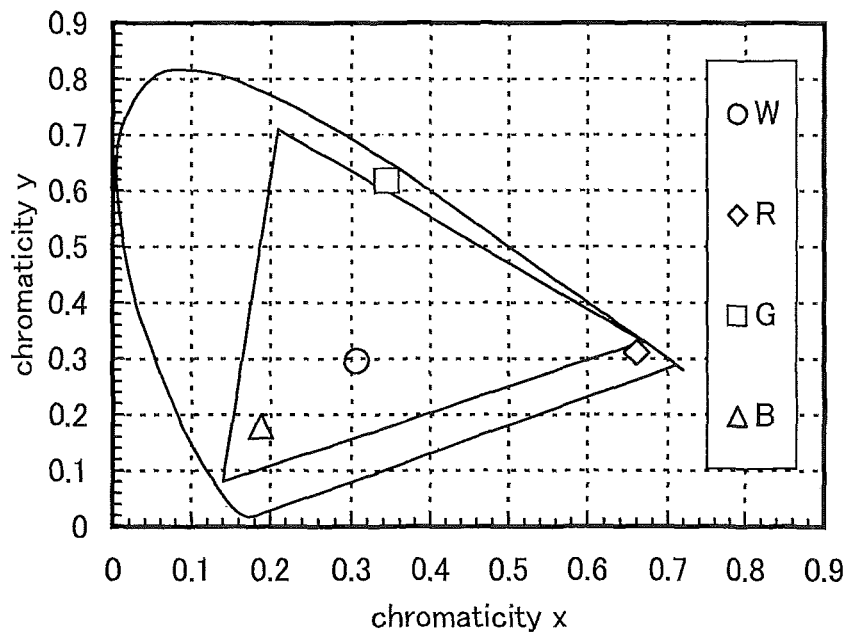

FIGS. 12A and 12B show the chromaticity coordinates of the example panel and the reference panel. FIG. 12A shows the chromaticity coordinates of the reference panel, while FIG. 12B shows the chromaticity coordinates of the example panel. In each of FIGS. 12A and 12B, the pixel for red (R), the pixel for green (G), and the pixel for blue (B) in the panel are shown by the rhombus, the square, and the triangle, respectively, and white (W) color exhibited by the display panel is shown by the white circle. The solid lines show NTSC ratios.

The chromaticity coordinates of white color exhibited by the reference panel are (x=0.30, y=0.37), and the chromaticity coordinates of white color exhibited by the example panel are (x=0.31, y=0.30). In addition, NTSC ratios of the example panel and the reference panel are both 59%. Therefore, it is known that the example panel is a display panel that can exhibit color purity substantially the same as that of the reference panel, even when not provided with a color filter layer in the B pixel.

Table 4 shows power consumption and NTSC ratios of the example panel and the reference panel.

TABLE 4

| | Pixels | | | NTSC<br>ratio<br>(%) | Total power<br>consumption<br>(a.u.) | Power<br>consumption<br>in lighting<br>rate of 20%<br>equivalent |
|---|---|---|---|---|---|---|
| | Red<br>pixel | Green<br>pixel | Blue<br>pixel | | | |
| Reference<br>panel | RCF | GCF | BCF | 59 | 1.00 | 1.00 |
| Example<br>panel | RCF | GCF | B | 59 | 0.62 | 0.67 |

The power consumption that is converted in a lighting rate of 20% equivalent described in Table 4 is a value obtained in the following manner: power consumption of pixels at a lighting rate of 20% is obtained first based on power (power consumption of the pixels) which is obtained by subtracting power consumption of a driver portion including a switching transistor, a driver circuit, and the like, from the power consumption at the lighting rate 100% (the total power consumption), and then, the power consumption of the driver portion is added to the power consumption of pixels at a lighting rate of 20%.

The example panel has no color filter layer in the pixel for blue, and thus the total power consumption of the example panel can be decreased to 0.62 of that of the reference panel and is decreased to 0.67 even in the lighting rate of 20% equivalent.

In addition, the example panel includes light-emitting elements that each can resonate light emitted from the light-emitting layer between the reflective electrode and the light-transmitting electrode and thus can have increased color purities. For that reason, the NTSC ratio substantially the same as that of the reference panel in which color filter layers are provided in the all pixels can be obtained even when no color filter layers are provided in some pixels (in this example, in the pixel for blue light).

From the above results, the example panel manufactured in this example can have lowered power consumption as well as maintain color reproducibility.

Reference Example

In this reference example, materials used in the light-emitting element R, the light-emitting element G, and the light-emitting element B in Examples described above.

Synthesis Example of 1,6mMemFLPAPrn

In this example, an example is described in which N,N'-bis(3-methylphenyl)-N,N'-bis[3-(9-phenyl-9H-fluoren-9-yl)phenyl]-pyrene-1,6-dia mine (abbreviation: 1,6mMemFL-PAPrn) used as the materials used in the light-emitting element R, the light-emitting element G, and the light-emitting element B is synthesized.

Step 1: Synthesis method of 3-methylphenyl-3-(9-phenyl-9H-fluoren-9-yl)phenylamine (abbreviation: mMemFLPA)

In a 200 mL three-neck flask were put 3.2 g (8.1 mmol) of 9-(3-bromophenyl)-9-phenylfluorene and 2.3 g (24.1 mmol) of sodium tert-butoxide. The air in the flask was replaced with nitrogen. To this mixture were added 40.0 mL of toluene, 0.9 mL (8.3 mmol) of ni-toluidine, and 0.2 mL of a 10% hexane solution of tri(tert-butyl)phosphine. The temperature of this mixture was set to 60° C., and 44.5 mg (0.1 mmol) of bis(dibenzylideneacetone)palladium(0) was added to the mixture. The temperature of the mixture was set to 80° C., followed by stirring for 2.0 hours. After the stirring, the mixture was suction-filtered through Florisil (produced by Wako Pure Chemical Industries, Ltd., Catalog No. 540-00135), Celite (produced by Wako Pure Chemical Industries, Ltd., Catalog No. 531-16855), and alumina to give a filtrate. The filtrate was concentrated to give a solid, which was then purified by silica gel column chromatography (the developing solvent has a 1:1 ratio of hexane to toluene) and recrystallized with a mixed solvent of toluene and hexane. Accordingly, 2.8 g of the target substance, white solid, was obtained in 82% yield. The synthesis scheme of this Step 1 is shown in (J-1).

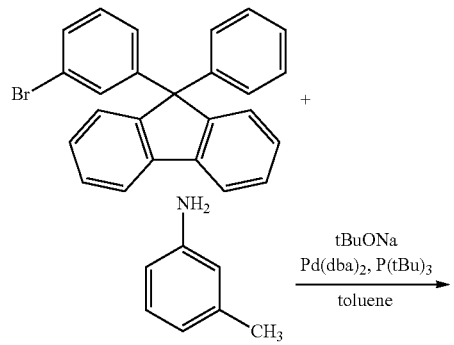

(J-1)

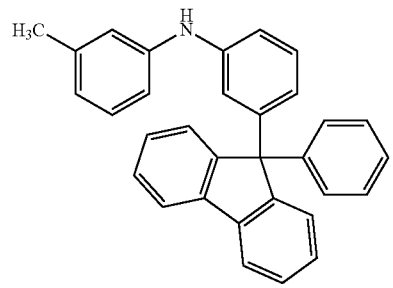

Step 2: Synthesis method of N,N'-bis(3-methylphenyl)-N,N'-bis[3-(9-phenyl-9H-fluoren-9-yl)phenyl]-pyrene-1,6-diamine (abbreviation: 1,6mMemFLPA-Prn)

In a 100 mL three-neck flask were put 0.6 g (1.7 mmol) of 1,6-dibromopyrene, 1.4 g (3.4 mmol) of 3-methylphenyl-3-(9-phenyl-9H-fluoren-9-yl)phenylamine, and 0.5 g (5.1 mmol) of sodium tert-butoxide. The air in the flask was replaced with nitrogen. To this mixture were added 21.0 mL of toluene and 0.2 mL of a 10% hexane solution of tri(tert-butyl)phosphine. The temperature of this mixture was set to 60° C., and 34.9 mg (0.1 mmol) of bis(dibenzylideneacetone)palladium(0) was added to the mixture, and this mixture was set to 80° C., followed by stirring for 3.0 hours. After the stirring, 400 mL of toluene was added to the mixture, and the mixture was heated. While the mixture was kept hot, it was suction-filtered through Florisil (produced by Wako Pure Chemical Industries, Ltd., Catalog No. 540-00135), Celite (produced by Wako Pure Chemical Industries, Ltd., Catalog No. 531-16855), and alumina to give a filtrate. The filtrate was concentrated to give a solid, which was then purified by silica gel column chromatography (the developing solvent has a 3:2 ratio of hexane to toluene) to give a yellow solid. Recrystallization of the obtained yellow solid from a mixed solvent of toluene and hexane gave 1.2 g of the target substance, yellow solid, in 67% yield.

By a train sublimation method, 1.0 g of the obtained yellow solid was purified. In the sublimation purification, the yellow solid was heated at 317° C. under a pressure of 2.2 Pa with a flow rate of argon gas of 5.0 mL/min. After the sublimation purification, 1.0 g of the target substance, yellow solid, was obtained in a yield of 93%. The synthesis scheme of Step 2 is shown in (J-2).

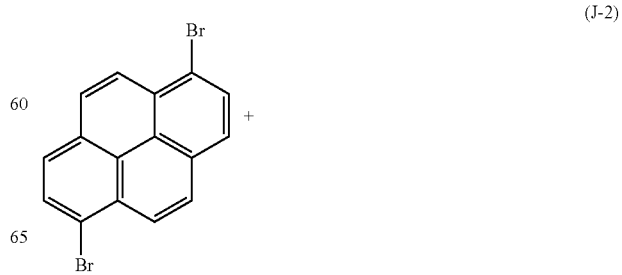

(J-2)

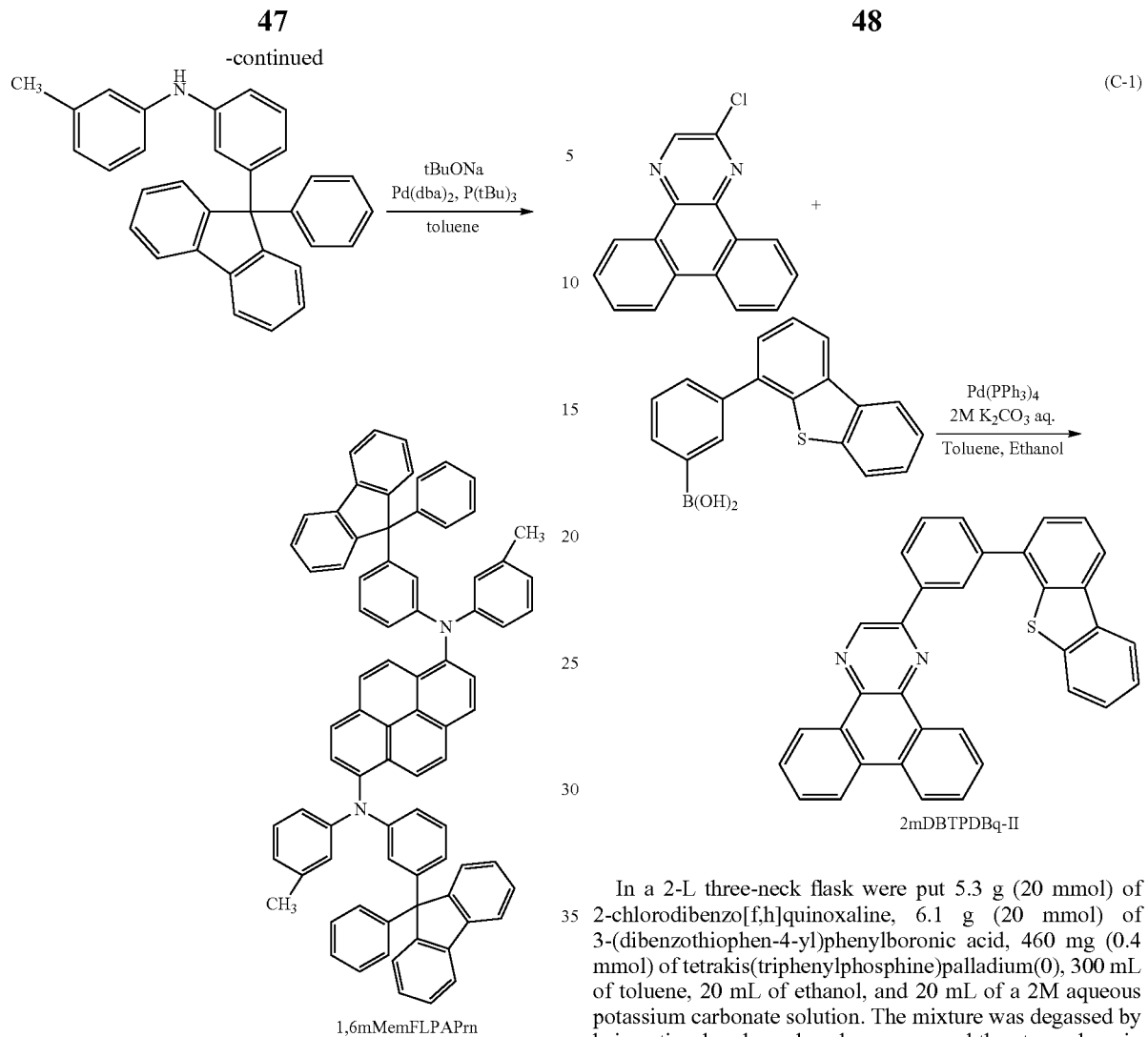

1,6mMemFLPAPrn

2mDBTPDBq-II

A nuclear magnetic resonance (NMR) method identified this compound as N,N'-bis(3-methylphenyl)-N,N'-bis[3-(9-phenyl-9H-fluoren-9-yl)phenyl]-pyrene-1,6-diamine (abbreviation: 1,6mMemFLPAPrn), which was the target substance.

$^1$H NMR data of the obtained compound is shown below.

$^1$H NMR (CDCl$_3$, 300 MHz): δ=2.21 (s, 6H), 6.67 (d, J=7.2 Hz, 2H), 6.74 (d, J=7.2 Hz, 2H), 7.17-7.23 (m, 34H), 7.62 (d, J=7.8 Hz, 4H), 7.74 (d, J=7.8 Hz, 2H), 7.86 (d, J=9.0 Hz, 2H), 8.04 (d, S=8.7 Hz, 4H)

Synthesis Example of 2mDBTPDBq-II

A synthesis method of 2-[3-(dibenzothiophen-4-yl)phenyl]dibenzo[f,h]quinoxaline (abbreviation: 2mDBTPDBq-II), which was used as the materials of the light-emitting element R, the light-emitting element G, and the light-emitting element B, will be described.

Synthesis of 2mDBTPDBq-II

A scheme for the synthesis of 2mDBTPDBq-II is shown in (C-1).

In a 2-L three-neck flask were put 5.3 g (20 mmol) of 2-chlorodibenzo[f,h]quinoxaline, 6.1 g (20 mmol) of 3-(dibenzothiophen-4-yl)phenylboronic acid, 460 mg (0.4 mmol) of tetrakis(triphenylphosphine)palladium(0), 300 mL of toluene, 20 mL of ethanol, and 20 mL of a 2M aqueous potassium carbonate solution. The mixture was degassed by being stirred under reduced pressure, and the atmosphere in the flask was substituted by nitrogen. This mixture was stirred under a nitrogen stream at 100° C. for 7.5 hours. After cooled to room temperature, the obtained mixture was filtered to give a white substance. The obtained substance by the filtration was washed with water and ethanol in this order, and then dried. The obtained solid was dissolved in about 600 mL of hot toluene, followed by suction filtration through Celite (produced by Wako Pure Chemical Industries, Ltd., Catalog No. 531-16855) and Florisil (produced by Wako Pure Chemical Industries, Ltd., Catalog No. 540-00135), whereby a clear colorless filtrate was obtained. The obtained filtrate was concentrated and purified by silica gel column chromatography. The chromatography was carried out using hot toluene as a developing solvent. Acetone and ethanol were added to the solid obtained here, followed by irradiation with ultrasonic waves. Then, the generated suspended solid was filtered and the obtained solid was dried to give 7.85 g of the target substance, white powder, in 80% yield.

The above target substance was relatively soluble in hot toluene, but is a material that is easy to precipitate when cooled. Further, the substance was poorly soluble in other organic solvents such as acetone and ethanol. Hence, the utilization of these different degrees of solubility resulted in a high-yield synthesis by such a simple method as above. Specifically, after the reaction finished, the mixture was returned to room temperature and the precipitated solid was collected by filtration, whereby most impurities were easily removed. Further, by the column chromatography with hot toluene as a developing solvent, the target substance, which is easy to precipitate, was readily purified.

By a train sublimation method, 4.0 g of the obtained white powder was purified. In the sublimation purification, the white powder was heated at 300° C. under a pressure of 5.0 Pa with a flow rate of argon gas of 5 mL/min. After the sublimation purification, 3.5 g of the target substance, white powder, was obtained in a yield of 88%.

A nuclear magnetic resonance (NMR) method identified this compound as 2-[3-(dibenzothiophen-4-yl)phenyl]dibenzo[f,h]quinoxaline (abbreviation: 2mDBTPDBq-II), which was the substance to be produced.

$^1$H NMR data of the obtained substance are as follows:

$^1$H NMR (CDCl$_3$, 300 MHz): δ (ppm)=7.45-7.52 (m, 2H), 7.59-7.65 (m, 2H), 7.71-7.91 (m, 7H), 8.20-8.25 (m, 2H), 8.41 (d, J=7.8 Hz, 1H), 8.65 (d, J=7.5 Hz, 2H), 8.77-8.78 (m, 1H), 9.23 (dd, J=7.2 Hz, 1.5 Hz, 1H), 9.42 (dd, J=7.8 Hz, 1.5 Hz, 1H), 9.48 (s, 1H).

Synthesis Example of Ir(mppm)$_2$(acac)

A synthesis example of (acetylacetonato)bis(6-methyl-4-phenylpyrimidinato)iridium(III) (abbreviation: Ir(mppm)$_2$(acac)), which was used as the materials of the light-emitting element R, the light-emitting element G, and the light-emitting element B will be described.

Step 1: Synthesis of 4-methyl-6-phenylpyrimidine (abbreviation: Hmppm)

First, in a recovery flask equipped with a reflux pipe were put 4.90 g of 4-chloro-6-methylpyrimidine, 4.80 g of phenylboronic acid, 4.03 g of sodium carbonate, 0.16 g of bis(triphenylphosphine)palladium(II) dichloride (abbreviation: Pd(PPh$_3$)$_2$Cl$_2$), 20 mL of water, and 10 mL of acetonitrile, and the air in the flask was replaced with argon. This reaction container was subjected to irradiation with microwaves (2.45 GHz, 100 W) for one hour to be heated. Here, in the flask were further put 2.28 g of phenylboronic acid, 2.02 g of sodium carbonate, 0.082 g of Pd(PPh$_3$)$_2$Cl$_2$, 5 mL of water, and 10 mL of acetonitrile, and the mixture was heated again by irradiation with microwaves (2.45 GHz, 100 W) for 60 minutes. After that, water was added to this solution and extraction with dichloromethane was carried out. The obtained solution of the extract was washed with a saturated sodium carbonate aqueous solution, water, and then with saturated saline, and dried with magnesium sulfate. The solution which had been dried was filtered. The solvent of this solution was distilled off, and then the obtained residue was purified by silica gel column chromatography using dichloromethane and ethyl acetate as a developing solvent in a volume ratio of 9:1, so that a pyrimidine derivative Hmppm, which was the target substance, was obtained (orange oily substance, yield of 46%). Note that the irradiation with microwaves was performed using a microwave synthesis system (Discover, manufactured by CEM Corporation). A synthesis scheme (b-1) of Step 1 is shown below.

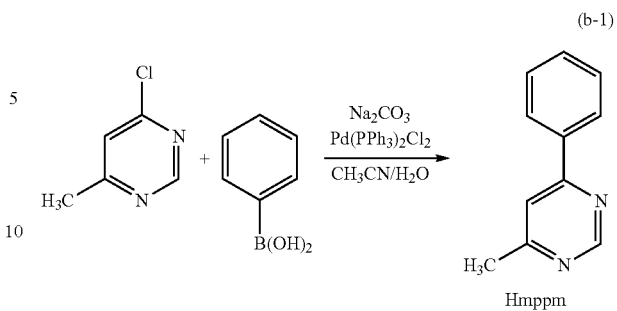

Step 2: Synthesis of Di-μ-chloro-bis[bis(6-methyl-4-phenylpyrimidinato)iridium(III)] (abbreviation: [Ir(mppm)$_2$Cl]$_2$)

Next, in a recovery flask equipped with a reflux pipe were put 15 mL of 2-ethoxyethanol, 5 mL of water, 1.51 g of Hmppm obtained in Step 1 above, and 1.26 g of iridium chloride hydrate (IrCl$_3$.H$_2$O), and the air in the flask was replaced with argon. After that, irradiation with microwaves (2.45 GHz, 100 W) was performed for 1 hour to cause a reaction. The solvent was distilled off, and then the obtained residue was washed with ethanol and filtered to give a dinuclear complex [Ir(mppm)$_2$Cl]$_2$ (dark green powder, yield of 77%). A synthesis scheme (b-2) of Step 2 is shown below.

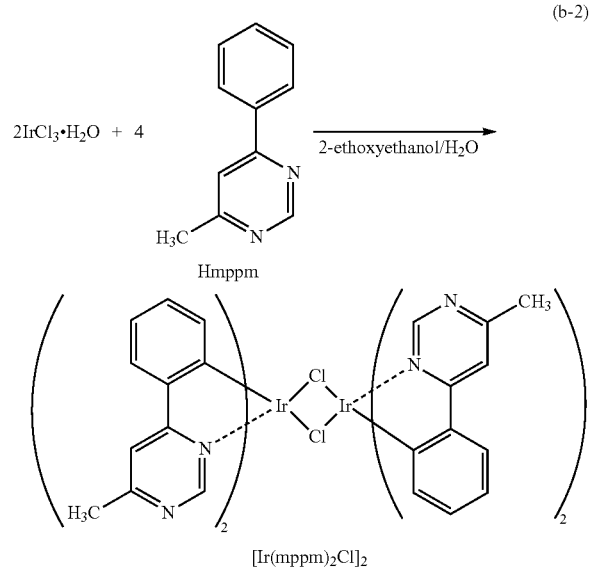

Step 3: Synthesis of (Acetylacetonato)bis(6-methyl-4-phenylpyrimidinato)iridium(III) (abbreviation: Ir(mppm)$_2$(acac))

Furthermore, into a recovery flask equipped with a reflux pipe were put 40 mL of 2-ethoxyethanol, 1.84 g of the dinuclear complex [Ir(mppm)$_2$Cl]$_2$ obtained in Step 2, 0.48 g of acetylacetone, and 1.73 g of sodium carbonate, and the air in the recovery flask was replaced with argon. Then, irradiation with microwaves (2.45 GHz, 100 W) for 60 minutes was performed to cause reaction. The solvent was distilled off, the obtained residue was dissolved in dichloromethane, and filtration was performed to remove insoluble matter. The obtained filtrate was washed with water and saturated saline, and was dried with magnesium sulfate. The solution which had been dried was filtered. The solvent of this solution was distilled off, and then the obtained residue was purified by silica gel column chromatography using dichloromethane and ethyl acetate as a developing solvent in a volume ratio of 4:1. After that, recrystallization was carried out with a mixed solvent of dichloromethane and hexane to give the target substance, yellow powder (in 44% yield). A synthesis scheme (b-3) of Step 3 is shown below.

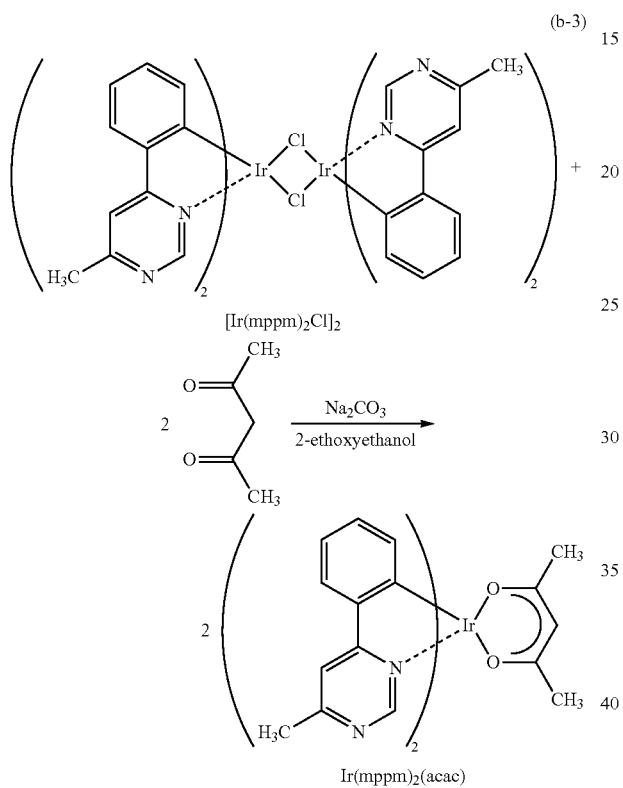

The result of nuclear magnetic resonance ($^1$H NMR) spectroscopy, by which the yellow powder obtained in Step 3 above was analyzed, is shown below. The result shows that this compound was (Acetylacetonato)bis(6-methyl-4-phenylpyrimidinato)iridium (III) (abbreviation: Ir(mppm)$_2$(acac), which was the target substance.

$^1$NMR. δ (CDCl$_3$): 1.78 (s, 6H), 2.81 (s, 6H), 5.24 (s, 1H), 6.37 (d, 2H), 6.77 (t, 2H), 6.85 (t, 2H), 7.61-7.63 (m, 4H), 8.97 (s, 2H).

This application is based on Japanese Patent Application serial no. 2011-048230 filed with Japan Patent Office on Mar. 4, 2011, the entire contents of which are hereby incorporated by reference.

What is claimed is:

1. A display device comprising:
   a first substrate;
   a first light-emitting element over the first substrate;
   a second light-emitting element over the first substrate;
   a third light-emitting element over the first substrate;
   a first color filter layer having a transmission center wavelength in a green wavelength region, the first color filter layer overlaps with the second light-emitting element; and
   a second color filter layer having a transmission center wavelength in a red wavelength region, the second color filter layer overlaps with the third light-emitting element,
   wherein the first light-emitting element, the second light-emitting element, and the third light-emitting element each comprises:
   a reflective electrode;
   a first light-emitting layer over the reflective electrode;
   a second light-emitting layer over the first light-emitting layer; and
   a light-transmitting electrode over the second light-emitting layer,
   wherein emission colors of the first light-emitting layer and the second light-emitting layer are different from each other,
   wherein a color filter layer overlapping with the first light-emitting element is not provided,
   wherein a distance between the reflective electrode and the light-transmitting electrode of the first light-emitting element, a distance between the reflective electrode and the light-transmitting electrode of the second light-emitting element, and a distance between the reflective electrode and the light-transmitting electrode of the third light-emitting element are different from each other, and
   wherein the first light-emitting element, the second light-emitting element, and the third light-emitting element each comprises a layer including an organic compound between the first light-emitting layer and the second light-emitting layer.

2. The display device according to claim 1,
   wherein the second light-emitting element comprises a first light-transmitting conductive layer over the reflective electrode,
   wherein the third light-emitting element comprises a second light-transmitting conductive layer over the reflective electrode, and
   wherein a thickness of the first light-transmitting conductive layer and a thickness of the second light-transmitting conductive layer are different from each other.

3. The display device according to claim 1, wherein an area of the first light-emitting element is smaller than an area of the third light-emitting element.

4. The display device according to claim 1,
   wherein the first light-emitting element, the second light-emitting element, and the third light-emitting element each comprises a layer including an organic compound between the reflective electrode and the light-transmitting electrode, and
   wherein a thickness of the layer of the first light-emitting element, a thickness of the layer of the second light-emitting element, and a thickness of the layer of the third light-emitting element are different from each other.

5. The display device according to claim 1, further comprising a metal plate and an adhesive layer between the first substrate and the metal plate.

6. The display device according to claim 1, wherein the first light-emitting layer and the second light-emitting layer comprise a phosphorescent compound.

7. A display device comprising:
   a first substrate;
   a first light-emitting element over the first substrate;
   a second light-emitting element over the first substrate;
   a third light-emitting element over the first substrate;

a first color filter layer having a transmission center wavelength in a green wavelength region, the first color filter layer overlaps with the second light-emitting element; and a second color filter layer having a transmission center wavelength in a red wavelength region, the second color filter layer overlaps with the third light-emitting element, wherein the first light-emitting element, the second light-emitting element, and the third light-emitting element each comprises:
a reflective electrode;
a first light-emitting layer over the reflective electrode;
a second light-emitting layer over the first light-emitting layer; and
a light-transmitting electrode over the second light-emitting layer, wherein emission colors of the first light-emitting layer and the second light-emitting layer are different from each other, wherein a distance between the reflective electrode and the light-transmitting electrode of the first light-emitting element, a distance between the reflective electrode and the light-transmitting electrode of the second light-emitting element, and a distance between the reflective electrode and the light-transmitting electrode of the third light-emitting element are different from each other, wherein a color filter layer overlapping with the first light-emitting element is not provided, wherein the second color filter layer has a maximum transmittance in the red wavelength region higher than a maximum transmittance of the first color filter layer region in the green wavelength region, and wherein the first light-emitting element, the second light-emitting element, and the third light-emitting element each comprises a layer including an organic compound between the first light-emitting layer and the second light-emitting layer.

8. The display device according to claim 7,
wherein the second light-emitting element comprises a first light-transmitting conductive layer over the reflective electrode,
wherein the third light-emitting element comprises a second light-transmitting conductive layer over the reflective electrode, and
wherein a thickness of the first light-transmitting conductive layer and a thickness of the second light-transmitting conductive layer are different from each other.

9. The display device according to claim 7, wherein an area of the first light-emitting element is smaller than an area of the third light-emitting element.

10. The display device according to claim 7,
wherein the first light-emitting element, the second light-emitting element, and the third light-emitting element each comprises a layer including an organic compound between the reflective electrode and the light-transmitting electrode, and
wherein a thickness of the layer of the first light-emitting element, a thickness of the layer of the second light-emitting element, and a thickness of the layer of the third light-emitting element are different from each other.

11. The display device according to claim 7, further comprising a metal plate and an adhesive layer between the first substrate and the metal plate.

12. The display device according to claim 7, wherein the first light-emitting layer and the second light-emitting layer comprise a phosphorescent compound.

13. A display device comprising:
a first substrate;
a first light-emitting element over the first substrate;
a second light-emitting element over the first substrate;
a third light-emitting element over the first substrate;
a first color filter layer having a transmission center wavelength in a green wavelength region, the first color filter layer overlaps with the second light-emitting element; and
a second color filter layer having a transmission center wavelength in a red wavelength region, the second color filter layer overlaps with the third light-emitting element,
wherein the first light-emitting element, the second light-emitting element, and the third light-emitting element each comprises:
a reflective electrode;
a first light-emitting layer over the reflective electrode;
a second light-emitting layer over the first light-emitting layer; and
a light-transmitting electrode over the second light-emitting layer,
wherein emission colors of the first light-emitting layer and the second light-emitting layer are different from each other,
wherein a distance between the reflective electrode and the light-transmitting electrode of the first light-emitting element, a distance between the reflective electrode and the light-transmitting electrode of the second light-emitting element, and a distance between the reflective electrode and the light-transmitting electrode of the third light-emitting element are different from each other,
wherein the first color filter layer has a maximum transmittance of 75% or more in the green wavelength region,
wherein a color filter layer overlapping with the first light-emitting element is not provided, and
wherein the first light-emitting element, the second light-emitting element, and the third light-emitting element each comprises a layer including an organic compound between the first light-emitting layer and the second light-emitting layer.

14. The display device according to claim 13, wherein the first color filter layer has a maximum transmission of 5% or more in a wavelength region of from 570 nm to 760 nm, inclusive.

15. The display device according to claim 13,
wherein the second light-emitting element comprises a first light-transmitting conductive layer over the reflective electrode,
wherein the third light-emitting element comprises a second light-transmitting conductive layer over the reflective electrode, and
wherein a thickness of the first light-transmitting conductive layer and a thickness of the second light-transmitting conductive layer are different from each other.

16. The display device according to claim 13, wherein an area of the first light-emitting element is smaller than an area of the third light-emitting element.

17. The display device according to claim 13,
wherein the first light-emitting element, the second light-emitting element, and the third light-emitting element each comprises a layer including an organic compound between the reflective electrode and the light-transmitting electrode, and wherein a thickness of the layer of the first light-emitting element, a thickness of the layer of the second light-emitting element, and a thickness of the layer of the third light-emitting element are different from each other.

18. The display device according to claim 13, further comprising a metal plate and an adhesive layer between the first substrate and the metal plate.

19. The display device according to claim 13, wherein the first light-emitting layer and the second light-emitting layer comprise a phosphorescent compound.

* * * * *

UNITED STATES PATENT AND TRADEMARK OFFICE
CERTIFICATE OF CORRECTION

| | |
|---|---|
| PATENT NO. | : 9,673,264 B2 |
| APPLICATION NO. | : 14/873938 |
| DATED | : June 6, 2017 |
| INVENTOR(S) | : Nobuharu Ohsawa et al. |

It is certified that error appears in the above-identified patent and that said Letters Patent is hereby corrected as shown below:

In the Specification

Column 4, Line 55; Change "polyimide" to --polyamide--.

Column 5, Lines 15 to 16; Change "600 nrm" to --600nm--.

Column 6, Line 65; Change "500 inn" to --500 nm--.

Column 9, Line 8; Change "(ZnS.SiO$_2$ film)" to --(ZnS·SiO$_2$ film)--.

Column 13, Line 20; Change "n-electron" to --π-electron--.

Column 14, Line 26; Change "(abbreviation PVTPA)," to --(abbreviation: PVTPA),--.

Column 14, Line 27; Change "phenyl-N-phenylamino}" to --phenyl-N'-phenylamino}--.

Column 14, Line 28; Change "(abbreviation PTPDMA)," to --(abbreviation: PTPDMA),--.

Column 15, Line 27; Change "b is" to --bis--.

Column 15, Line 59; Change "4,4=-bis" to --4,4'-bis--.

Column 16, Line 49; Change "BAlq)," to --BAlq),--.

Column 17, Line 4; Change "TPB 3)," to --TPB3),--.

Column 17, Line 46; Change "BAlq)." to --BAlq).--.

Signed and Sealed this
Third Day of October, 2017

Joseph Matal
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 9,673,264 B2

Column 19, Line 10; Change "N,N,'N'-triphenyl" to --N,N',N'-triphenyl--.

Column 19, Line 48; Change "(4-methylphenyeacenaphtho" to --(4-methylphenyl)acenaphtho--.

Column 20, Line 15; Change "diphenyl amino)" to --diphenylamino)--.

Column 22, Line 34; Change "N,N-dihexyl" to --N,N'-dihexyl--.

Column 22, Line 48; Change "N,N-bis" to --N,N'-bis--.

Column 22, Line 49; Change "naphthalenetetracar boxylic" to --naphthalenetetracarboxylic--.

Column 25, Line 12; Change "fainted" to --formed--.

Column 32, Line 52; Change "element and" to --element G, and--.

Column 32, Line 60; Change "dia mine" to --diamine--.

Column 34, Line 32; Change "1,6mMemFLPAPm" to --1,6mMemFLPAPrn--.

Column 39, Line 44; Change "(x, y) 0.60)," to --(x, y) = (0.38, 0.60),--.

Column 39, Line 52; Change "(x, y) 0.67)," to --(x, y) = (0.31, 0.67),--.

Column 45, Line 21; Change "dia mine" to --diamine--.

Column 45, Line 34; Change "ni-toluidine," to --m-toluidine,--.

Column 47, Line 52; Change "S=8.7" to --J=8.7--.

Column 50, Line 23; Change "(IrCl$_3$.H$_2$O)," to --(IrCl$_3$·H$_2$O),--.